(12) United States Patent
Chang et al.

(10) Patent No.: US 11,715,638 B2
(45) Date of Patent: Aug. 1, 2023

(54) METHOD FOR FORMING SEMICONDUCTOR STRUCTURE

(71) Applicant: Taiwan Semiconductor Manufacturing Company, Ltd., Hsinchu (TW)

(72) Inventors: Yu-Chen Chang, Hsinchu (TW); Chien-Wen Lai, Hsinchu (TW); Chih-Min Hsiao, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 24 days.

(21) Appl. No.: 17/378,419

(22) Filed: Jul. 16, 2021

(65) Prior Publication Data

US 2023/0015618 A1    Jan. 19, 2023

(51) Int. Cl.
  *H01L 21/033* (2006.01)
  *H01L 21/3105* (2006.01)
  *H01L 21/311* (2006.01)
  *H01L 21/308* (2006.01)

(52) U.S. Cl.
  CPC ...... *H01L 21/0337* (2013.01); *H01L 21/3086* (2013.01); *H01L 21/31051* (2013.01); *H01L 21/31144* (2013.01)

(58) Field of Classification Search
  CPC ............. H01L 21/0337; H01L 21/3086; H01L 21/31051; H01L 21/31144
  USPC .......................................................... 438/696
  See application file for complete search history.

(56) References Cited

U.S. PATENT DOCUMENTS

| | | | |
|---|---|---|---|
| 8,465,908 B2 * | 6/2013 | Choi | G03F 7/095 430/312 |
| 10,685,874 B1 * | 6/2020 | Xie | H01L 21/76816 |
| 2009/0170330 A1 * | 7/2009 | Jung | H01L 27/11517 257/E21.249 |
| 2021/0391173 A1 * | 12/2021 | Chen | H01L 21/76816 |

* cited by examiner

*Primary Examiner* — Duy Vu N Deo
(74) *Attorney, Agent, or Firm* — Birch, Stewart, Kolasch & Birch, LLP

(57) ABSTRACT

A method for forming a semiconductor structure includes forming a hard mask layer over a target layer. The method also includes forming first mandrels over the hard mask layer. The method also includes forming a first opening in the first mandrels. The method also includes depositing a spacer layer over the hard mask layer and the first mandrels. The method also includes depositing a second mandrel material over the spacer layer. The method also includes planarizing the second mandrel material. The method also includes forming a second opening in the second mandrel material. The method also includes patterning and etching the second mandrel material to form second mandrels. The method also includes etching the spacer layer. The method also includes etching the hard mask layer and the target layer.

20 Claims, 36 Drawing Sheets

US 11,715,638 B2

METHOD FOR FORMING SEMICONDUCTOR STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-1, 2B-1, 2C-1, 2D-1, 2E-1, 2F-1, 2G-1, 2H-1, 2I-1, 2J-1 are perspective representations of various stages of forming a semiconductor structure, in accordance with some embodiments of the disclosure.

FIGS. 2A-2, 2A-3, 2B-2, 2B-3, 2B-4, 2C-2, 2C-3, 2D-2, 2D-3, 2E-2, 2E-3, 2F-2, 2F-3, 2F-4, 2G-2, 2G-3, 2H-2, 2H-3, 2H-4, 2I-2, 2I-3, 2I-4, 2J-2, 2J-3, 2J-4 are cross-sectional representations of various stages of forming a semiconductor structure, in accordance with some embodiments of the disclosure.

DETAILED DESCRIPTION

Figure 1:
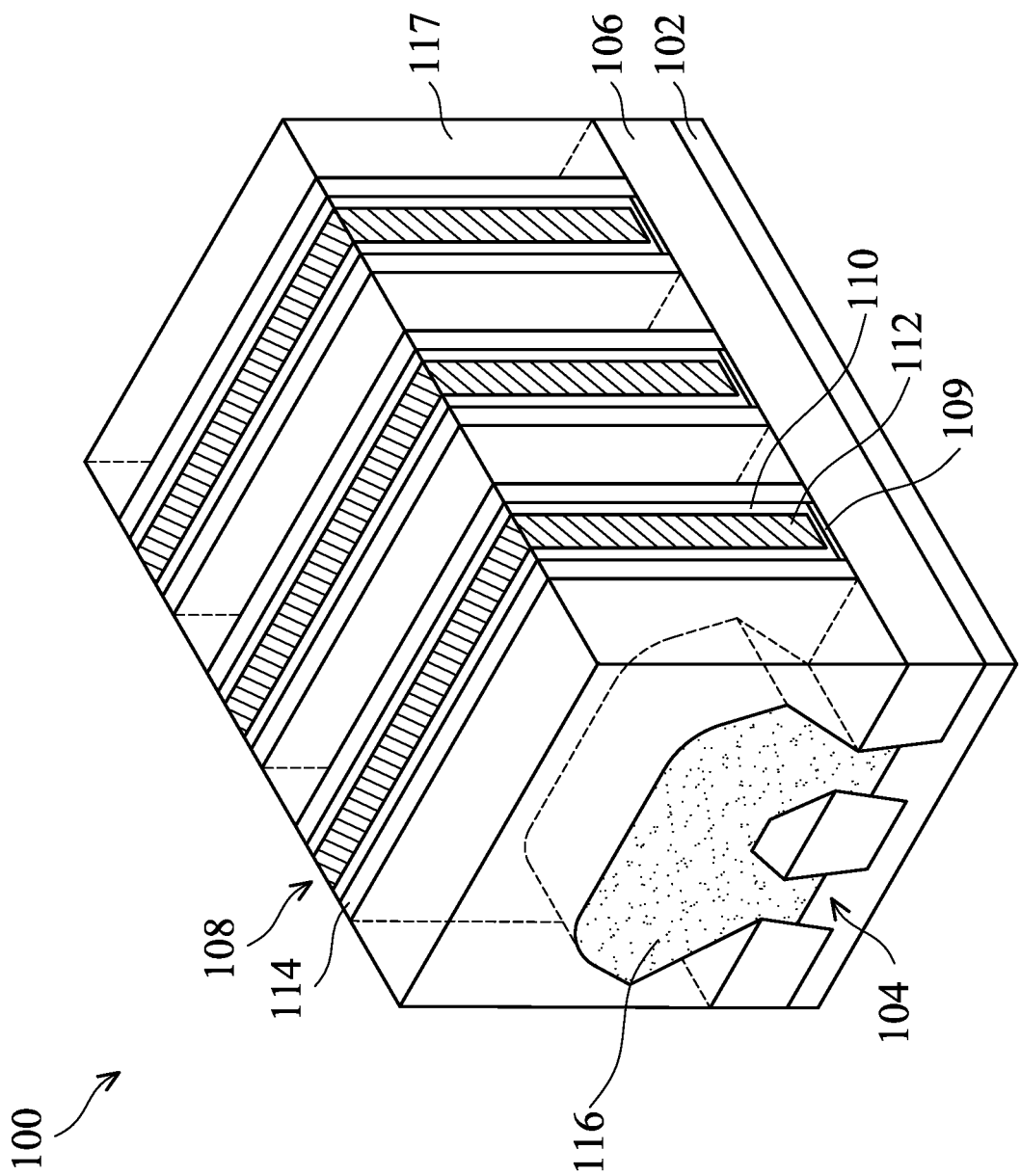
FIG. 1 is a perspective representation of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Fin structures described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Herein, the terms "around," "about," "substantial" usually mean within 20% of a given value or range, and better within 10%, 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Embodiments for forming a semiconductor structure are provided. The method for forming the semiconductor structure may include using a line-based self-aligned litho-etch-litho-etch (LELE) process to form metal lines with small pitch. In the LELE process, the position of the opening in the second mandrels may be defined after depositing the second mandrel material. Since the reverse-tone step is skipped, the production time and cost may be reduced.

FIG. 1 is a perspective representation of a semiconductor structure 10a, in accordance with some embodiments of the disclosure. A substrate 102 is provided as shown in FIG. 1 in accordance with some embodiments. The substrate 102 may be a semiconductor wafer such as a silicon wafer. The substrate 102 may also include other elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium nitride, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. The substrate 102 may include an epitaxial layer. For example, the substrate 102 has an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX) process, other applicable methods, or a combination thereof. The substrate 102 may be an N-type substrate. The substrate 102 may be a P-type substrate.

Next, a pad layer may be blanketly formed over the substrate 102, and a hard mask layer may be blanketly formed over the pad layer (not shown). The pad layer may be a buffer layer between the substrate 102 and the hard mask layer. In addition, the pad layer may be used as a stop layer when the hard mask layer is removed. The pad layer may be made of silicon oxide. The hard mask layer may be made of silicon oxide, silicon nitride, silicon oxynitride, or another applicable material. The pad layer and the hard mask layer may be formed by deposition processes, such as a chemical vapor deposition (CVD) process, a high-density plasma chemical vapor deposition (HDPCVD) process, a spin-on process, a sputtering process, or another applicable process.

Afterwards, a photoresist layer may be formed over the hard mask layer (not shown). The photoresist layer may be patterned by a patterning process. The patterning process may include a photolithography process and an etching process. Examples of photolithography processes include photoresist coating (e.g., spin-on coating), soft baking, mask aligning, exposure, post-exposure baking, developing the photoresist, rinsing and drying (e.g., hard baking). The etching process may be a dry etching process or a wet etching process. As a result, a patterned pad layer and a patterned hard mask layer may be obtained. Afterwards, the patterned photoresist layer may be removed.

Afterwards, an etching process is performed on the substrate 102 to form a fin structure 104 by using the hard mask layer as a mask as shown in FIG. 1 in accordance with some embodiments. The etching process may be a dry etching process or a wet etching process. In some embodiments, the substrate 102 is etched by a dry etching process. The dry etching process may include using a fluorine-based etchant gas, such as $SF_6$, $C_xF_y$ (where x and y may be positive integers), $NF_3$, or a combination thereof. The etching process may be a time-controlled process, and continue until the fin structure 104 reaches a predetermined height. It should be noted that since the fin structure 104 and the substrate 102 are made of the same material, and there is no obvious interface between them.

Next, a liner layer may be conformally formed on the sidewalls and the top surface of the fin structure 104 (not shown). The liner layer may be used to protect the fin structure 104 from being damaged in the following processes (such as an anneal process or an etching process). The liner layer may be made of silicon nitride.

Next, an isolation layer 106 is formed to cover the fin structure 104 and the substrate 102 as shown in FIG. 1 in accordance with some embodiments, The isolation layer 106 may be made of silicon oxide, silicon nitride, silicon oxynitride, fluoride-doped silicate glass (FSG), or another low-k dielectric material. The isolation layer 106 may be deposited by a deposition process, such as a chemical vapor deposition (CVD) process, a spin-on-glass process, or another applicable process.

Afterwards, the isolation layer 106 may be planarized to expose the top surface of the patterned hard mask layer (not shown). The isolation layer 106 may be planarized by a chemical mechanical polishing (CMP) process. Afterwards, the patterned hard mask layer may be removed. The patterned hard mask layer may be removed by a wet etching process. The wet etching process may include using a phosphoric acid ($H_3PO_4$) etching solution.

Next, an etching process is performed on the isolation layer 106, as shown in FIG. 1 in accordance with some embodiments. The etching process may be used to remove a portion of the liner layer and a portion of the isolation layer 106. As a result, the top portion of the fin structure 104 may be exposed and the remaining isolation layer 106 may surround the base portion of the fin structure 104. The remaining isolation layer 106 may be an isolation structure 106 such as a shallow trench isolation (STI) structure surrounding the base portion of the fin structure 104. The isolation structure 106 may be configured to prevent electrical interference or crosstalk.

Next, a gate structure 108 is formed over and across the fin structures 104, as shown in FIG. 1 in accordance with some embodiments. The gate structure 108 may include an interfacial layer 109, a gate dielectric layer 110 and a gate electrode layer 112. The gate dielectric layer 110 may be a dummy gate dielectric layer and the gate electrode layer 112 may be a dummy gate electrode layer. The dummy gate dielectric layer and the dummy gate electrode layer may be replaced by the following steps to form a real gate structure with a high-k dielectric layer and a metal gate electrode layer.

The interfacial layer 109 may include silicon oxide. The silicon oxide may be formed by an oxidation process (such as a dry oxidation process, or a wet oxidation process), deposition process (such as a chemical vapor deposition (CVD) process or an atomic layer deposition (ALD) process), other applicable processes, or a combination thereof. The interfacial layer 109 may be thermally grown using a thermal oxidation process in oxygen-containing ambient or nitrogen-containing ambient (e.g. NO or $N_2O$).

The gate dielectric layer 110 may include silicon oxide. The silicon oxide may be formed by an oxidation process (e.g., a dry oxidation process, or a wet oxidation process), a chemical vapor deposition process, other applicable processes, or a combination thereof. Alternatively, the gate dielectric layer 110 may include a high-k dielectric layer (e.g., the dielectric constant is greater than 3.9) such as hafnium oxide ($HfO_2$). Alternatively, the high-k dielectric layer may include other high-k dielectrics, such as LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, (Ba, Sr)$TiO_3$, $Al_2O_3$, other applicable high-k dielectric materials, or a combination thereof. The high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

The gate electrode layer 112 may include polycrystalline-silicon (poly-Si), poly-crystalline silicon-germanium (poly-SiGe), metals (e.g., tungsten, titanium, aluminum, copper, molybdenum, nickel, platinum, the like, or a combination thereof), metal alloys, metal-nitrides (e.g., tungsten nitride, molybdenum nitride, titanium nitride, and tantalum nitride, the like, or a combination thereof), metal-silicides (e.g., tungsten silicide, titanium silicide, cobalt silicide, nickel silicide, platinum silicide, erbium silicide, the like, or a combination thereof), metal-oxides (e.g., ruthenium oxide, indium tin oxide, the like, or a combination thereof), other applicable materials, or a combination thereof. The gate electrode layer 112 may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

Afterwards, an etching process may be performed on the gate dielectric layer 110 and the gate electrode layer 112 to form the gate structure 108 by using a patterned photoresist layer as a mask (not shown). The etching process may be a dry etching process or a wet etching process. In some embodiments, the gate dielectric layer 110 and the gate electrode layer 112 are etched by a dry etching process. The dry etching process may include using a fluorine-based etchant gas, such as $SF_6$, $C_xF_y$ (where x and y may be positive integers), $NF_3$, or a combination thereof. After the etching process, the top portion of the fin structure 104 may be exposed on opposite sides of the gate structure 108.

Next, a pair of spacers 114 are formed on opposite sidewalls of the gate structure 108, as shown in FIG. 1 in accordance with some embodiments. The spacers 114 may be made of silicon oxide, silicon nitride, silicon oxynitride, and/or dielectric materials. The spacers 114 may be formed by a chemical vapor deposition (CVD) process, a spin-on-glass process, or another applicable process.

Afterwards, the top portion of the fin structure 104 exposed on opposite sides of the gate structure 108 may be removed in an etching process to form a recess (not shown). The etching process may be a dry etching process or a wet etching process. The fin structures 104 may be etched by a dry etching process. The dry etching process may include using a fluorine-based etchant gas, such as $SF_6$, $C_xF_y$ (where x and y may be positive integers), $NF_3$, or a combination thereof.

Next, a source/drain epitaxial structure 116 is formed in the recess over the fin structure 104 on opposite sides of the gate structure 108, as shown in FIG. 1 in accordance with some embodiments. A strained material may be grown in the recess by an epitaxial (epi) process to form the source/drain epitaxial structure 116. In addition, the lattice constant of the strained material may be different from the lattice constant of the substrate 102. The source/drain epitaxial structure 116 may include Ge, SiGe, InAs, InGaAs, InSb, GaAs, GaSb, InAlP, InP, SiC, SiP, other applicable materials, or a combination thereof. The source/drain epitaxial structure 116 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method.

After the source/drain epitaxial structure 116 is formed, a first inter-layer dielectric (ILD) structure 117 is formed to cover the source/drain epitaxial structure 116, as shown in FIG. 1 in accordance with some embodiments. The first ILD structure 117 may surround the fin structure 104 and the source/drain epitaxial structure 116.

The first ILD structure 117 may include multilayers made of multiple dielectric materials, such as silicon oxide ($SiO_x$, where x may be a positive integer), silicon oxycarbide ($SiCO_y$, where y may be a positive integer), silicon oxycarbonitride ($SiNCO_z$, where z may be a positive integer), silicon nitride, silicon oxynitride, phosphosilicate glass (PSG), borophosphosilicate glass (BPSG), low-k dielectric material, or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The first ILD structure 117 may be formed by chemical vapor deposition (CVD), spin-on coating, or other applicable processes.

Afterwards, a planarizing process is performed on the first ILD structure 117 until the top surface of the gate structure 108 is exposed, as shown in FIG. 1 in accordance with some embodiments. After the planarizing process, the top surface of the gate structure 108 may be substantially level with the top surfaces of the spacers 114 and the first ILD structure 117. The planarizing process may include a grinding process, a chemical mechanical polishing (CMP) process, an etching process, other applicable processes, or a combination thereof.

Next, the gate structure 108 is recessed to form a recess (not shown). The recessing process may include one or more etching processes, such as dry etching and/or wet etching.

Next, a gate cap layer is formed in the recess above the gate structure 108 (not shown). The gate cap layer may provide isolation for subsequently formed contact structure and conductive elements nearby. The gate cap layer may be made of dielectric materials such as LaO, AlO, Si, YO, TaCN, ZrSi, SiOCN, SiOC, SiCN, LaO, ZrN, ZrAlO, TiO, TaO, ZrO, HfO, SiN, HfSi, AlON, SiO, SiC, ZnO, other applicable materials, or a combination thereof. The gate cap layer may be deposited in the trench by CVD (such as HDP-CVD, PECVD, or HARP), ALD, another suitable method, and/or a combination thereof. After the gate cap layer is deposited, a planarization process (e.g., a chemical mechanical polishing process or an etching back process) may optionally be performed to remove excess dielectric materials.

Afterwards, a patterning and an etching process are performed to form a hole in the first ILD structure 117 by using a patterned photoresist layer as a mask (not shown). The patterning process may include a photolithography process and an etching process. Examples of photolithography processes include photoresist coating, soft baking, mask aligning, exposure, post-exposure baking, developing the photoresist, rinsing and drying. The etching process may be a dry etching process or a wet etching process. A portion of the source/drain epitaxial structure 116 may be exposed from the hole.

Next, a metal semiconductor compound layer may be formed over the source/drain epitaxial structure 116 (not shown). The metal semiconductor compound layer may reduce the contact resistance between the source/drain epitaxial structure 116 and the subsequently formed contact structure over the source/drain epitaxial structure 116. The metal semiconductor compound layer may be made of titanium silicide ($TiSi_2$), nickel silicide (NiSi), cobalt silicide (CoSi), or other suitable low-resistance materials. The metal semiconductor compound layer may be formed over the source/drain epitaxial structure 116 by forming a metal layer over the source/drain epitaxial structure 116 first. The metal layer may react with the source/drain epitaxial structure 116 in an annealing process and a metal semiconductor compound layer may be produced. Afterwards, the unreacted metal layer may be removed in an etching process and the metal semiconductor compound layer may be left.

Afterwards, a contact structure is formed into the trench over the source/drain epitaxial structure 116 (not shown). The contact structure may be made of metal materials (e.g., Co, Ni, W, Ti, Ta, Cu, Al, Ru, Mo, TiN, TaN, and/or a combination thereof), metal alloys, poly-Si, other applicable conductive materials, or a combination thereof. The contact structure may be formed by a chemical vapor deposition process (CVD), a physical vapor deposition process (PVD), (e.g., evaporation or sputter), an atomic layer deposition process (ALD), an electroplating process, another suitable process, or a combination thereof to deposit the conductive materials of the contact structure, and then a planarization process such as a chemical mechanical polishing (CMP) process or an etch back process is optionally performed to remove excess conductive materials. After the planarization process, the top surface of the contact structure may be level with the top surface of the gate cap layer and the top surface of the first ILD structure 117.

Afterwards, an etch stop layer is formed over the first ILD structure 117 (not shown). The etch stop layer may be made of an insulating material such as a dielectric material (e.g., SiC, LaO, AlO, AlON, ZrO, HfO, SiN, ZnO, ZrN, ZrAlO, TiO, TaO, YO, TaCN, ZrSi, SiOCN, SiOC, SiCN, HfSi, or SiO) or undoped silicon. The etch stop layer may be formed using CVD (such as LPCVD, PECVD, HDP-CVD, HARP, and FCVD), ALD, another suitable method, or a combination thereof.

The semiconductor structure 10a shown in FIG. 1 may be a semiconductor device 100 fabricated in front-end-of-line (FEOL) process. Afterwards, a back-end-of-line (BEOL) process may be performed over the semiconductor device 100.

FIGS. 2A-1, 2B-1, 2C-1, 2D-1, 2E-1, 2F-1, 2G-1, 2H-1, 2I-1, 2J-1 are perspective representations of various stages of forming a semiconductor structure, in accordance with some embodiments of the disclosure. FIGS. 2A-2, 2A-3, 2B-2, 2B-3, 2B-4, 2C-2, 2C-3, 2D-2, 2D-3, 2E-2, 2E-3, 2F-2, 2F-3, 2F-4, 2G-2, 2G-3, 2H-2, 2H-3, 2H-4, 2I-2, 2I-3, 2I-4, 2J-2, 2J-3, 2J-4 are cross-sectional representations of various stages of forming a semiconductor structure, in accordance with some embodiments of the disclosure. FIGS. 2A-2, 2B-2, 2C-2, 2D-2, 2E-2, 2F-2, 2G-2, 2H-2, 2I-2, 2J-2 show cross-sectional representations taken along line 2-2 in FIGS. 2A-1, 2B-1, 2C-1, 2D-1, 2E-1, 2F-1, 2G-1, 2H-1, 2I-1, 2J-1 respectively. FIGS. 2A-3, 2B-3, 2C-3, 2D-3, 2E-3, 2F-3, 2G-3, 2H-3, 2I-3, 2J-3 show cross-sectional representations taken along line 3-3 in FIGS. 2A-1, 2B-1, 2C-1, 2D-1, 2E-1, 2F-1, 2G-1, 2H-1, 2I-1, 2J-1 respectively. FIGS. 2B-4, 2F-4, 2H-4, 2I-4, 2J-4 show cross-sectional representations taken along line 4-4 in FIGS. 2B-1, 2F-1, 2H-1, 2I-1, 2J-1 respectively.

A target layer 118 is formed over the semiconductor device 100, as shown in FIGS. 2A-1, 2A-2, 2A-3 in accordance with some embodiments. The material of the target layer 118 may be Ru, Ta, TaN, TiN, Cu, Co, W, Al, Mo, Ir, other applicable metal materials, or a combination thereof. The material of the target layer 118 may also be dielectric such as silicon oxide, silicon nitride, silicon oxynitride, other applicable dielectric materials, or a combination thereof. The target layer 118 may be blanketly formed over the semiconductor device 100 by depositing the target layer material using a physical vapor deposition process (PVD) (e.g., evaporation or sputtering), an atomic layer deposition process (ALD), an electroplating process, a chemical vapor deposition process (CVD) process, another applicable process, or a combination thereof.

Next, a hard mask layer 120 is formed over the target layer 118, as shown in FIGS. 2A-1, 2A-2, 2A-3 in accordance with some embodiments. The hard mask layer 120 may be a hard mask for subsequently etching of the target layer 118. The hard mask layer 120 may include Si, SiO, SiN, SiCN, SiON, SiOC, metal nitrides, metal carbide, metal oxide, metals, other applicable materials, or a combination thereof. The hard mask layer 120 may be formed by chemical vapor deposition process (CVD), a physical vapor deposition process (PVD), (e.g., evaporation or sputter), an atomic layer deposition process (ALD), other suitable processes, or a combination thereof to blanketly deposit a hard mask layer 120 over the target layer 118.

It should be noted that, although the hard mask layer 120 is a single layer as shown in FIGS. 2A-1, 2A-2, 2A-3, the hard mask layer 120 may also be a multi-layer structure. In addition, the number of the hard mask layer 120 is not limited herein, depending on the demand of pattern transferring.

Next, a first mandrel material is blanketly formed over the hard mask layer 120 (not shown). The first mandrel material may be a hard mask for subsequently etching of the hard mask layer 120. The first mandrel material may include SiO, Si, SiN, SiCN, SiON, SiOC, metal nitrides such as TaN, metal carbide, metal oxide, metals, other applicable materials, or a combination thereof. In some embodiments, the first mandrel material and the hard mask layer 120 are made of different materials. Therefore, there may be etch selectivity between the first mandrel material and the hard mask layer 120 in subsequent etching process. The first mandrel material may be formed by chemical vapor deposition process (CVD), a physical vapor deposition process (PVD), (e.g., evaporation or sputter), an atomic layer deposition process (ALD), other suitable processes, or a combination thereof to blanketly deposit a first mandrel material over the hard mask layer 120.

Figures 1, 2A:
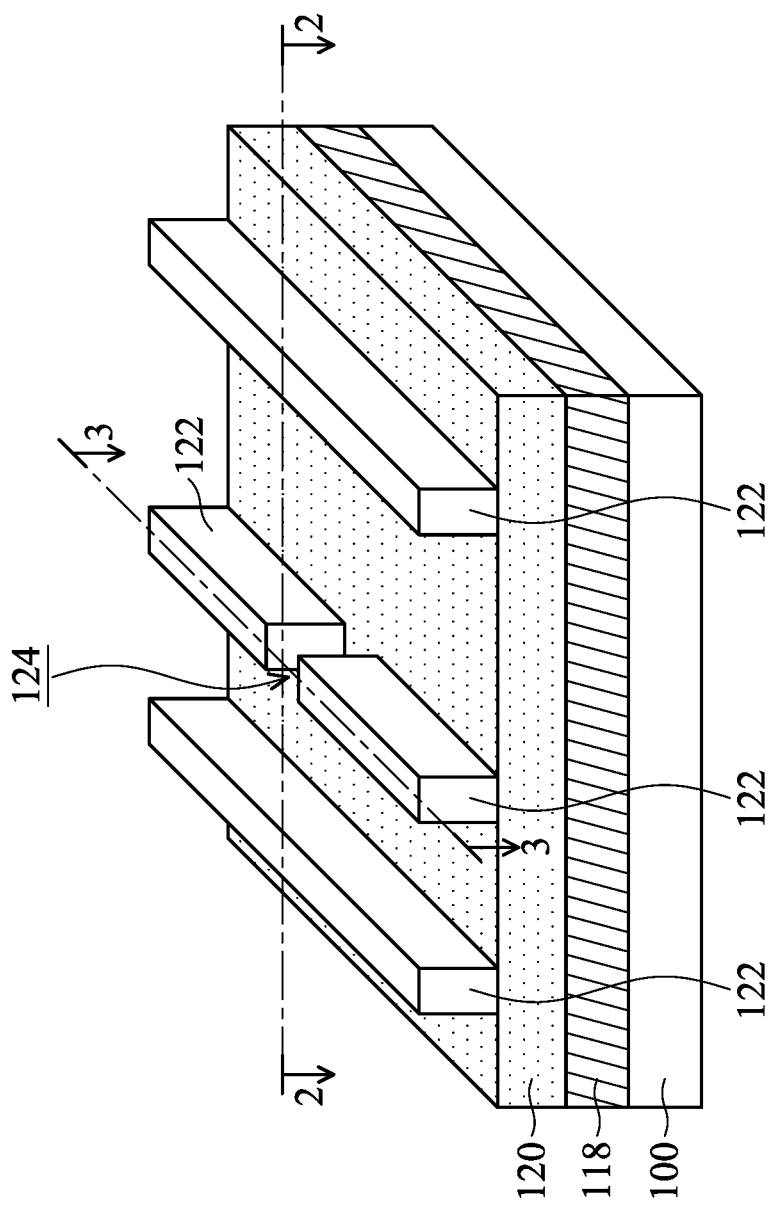
Figures 2, 2A:
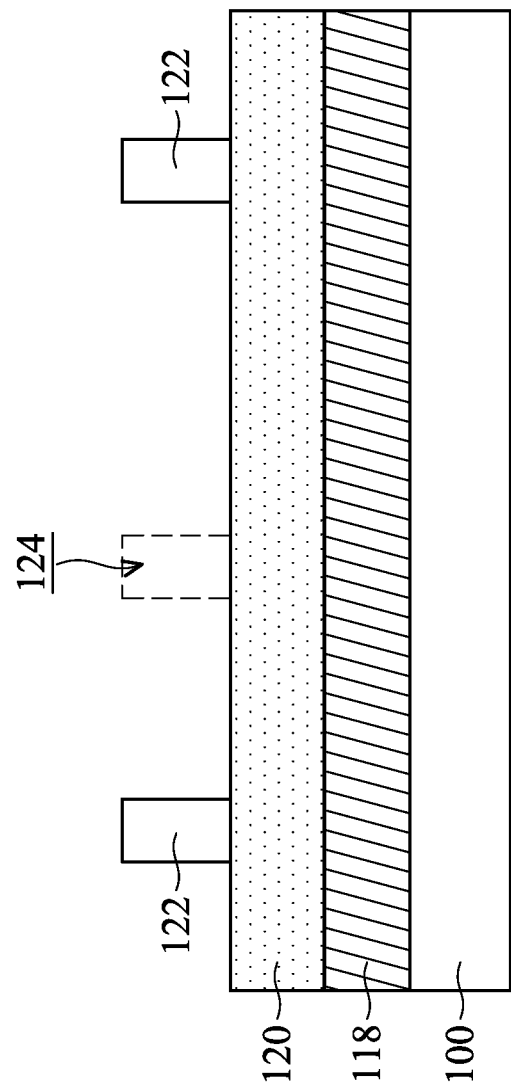
Figures 2, 2A, 3:
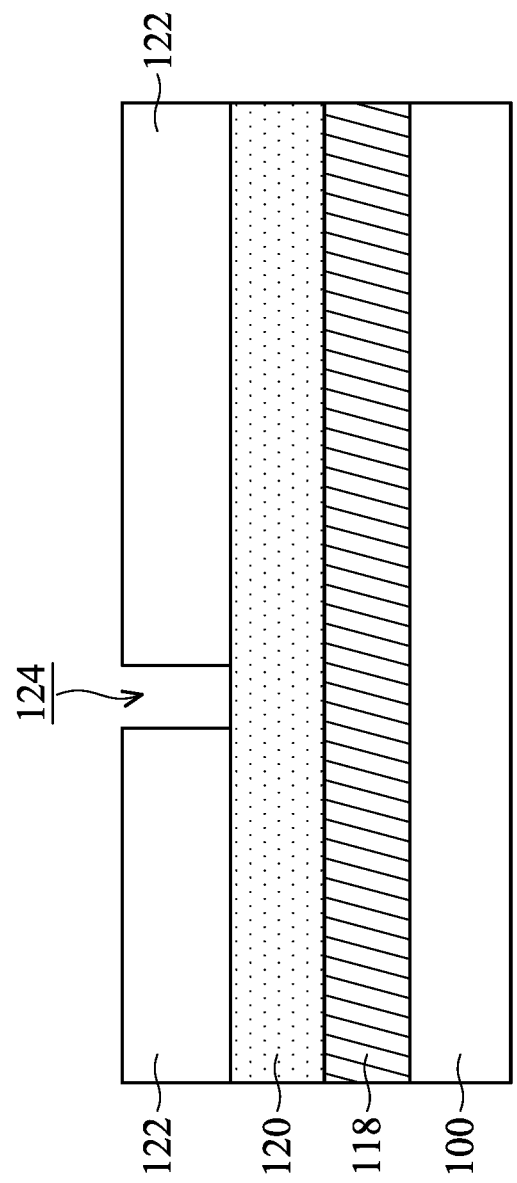

Next, the first mandrel material is patterned to form first mandrels 122, as shown in FIGS. 2A-1, 2A-2, 2A-3 in accordance with some embodiments. In some embodiments, a first opening 124 is formed in the first mandrels 122, and the hard mask layer 120 is exposed in the first opening 124. In some embodiments as shown in FIG. 2A-2, the dashed box shows the first opening 124 formed in the first mandrels 122. The patterning process may include a lithography process (e.g., coating the resist, soft baking, exposure, post-exposure baking, developing, other applicable processes, or a combination thereof), an etching process (e.g., wet etching process, dry etching process, other applicable processes, or a combination thereof), other applicable processes, or a combination thereof. In some embodiments, the critical dimension of the first mandrels 122 is in a range of about 10 nm to about 150 nm.

Next, a spacer layer 126 is deposited over the first mandrels 122, as shown in FIGS. 2B-1, 2B-2, 2B-3, 2B-4 in accordance with some embodiments. In some embodiments, the spacer layer 126 is conformally formed over the first mandrels 122 and the hard mask layer 120. The spacer layer 126 may include SiO, SiN, metal oxide, other applicable materials, or a combination thereof. The spacer layer 126 may be formed by chemical vapor deposition process (CVD), a physical vapor deposition process (PVD), (e.g., evaporation or sputter), an atomic layer deposition process (ALD), other suitable processes, or a combination thereof to conformally form a spacer layer 126 over the first mandrels 122.

In some embodiments, the spacer layer 126 over the first mandrels 122 is higher than the spacer layer 126 in the first opening 124. In some embodiments as shown in FIG. 2B-2, the height H1 of the spacer layer 126 over the first mandrels 122 is greater than the height H2 of the spacer layer 126 in the first opening 124.

Figures 1, 2B:
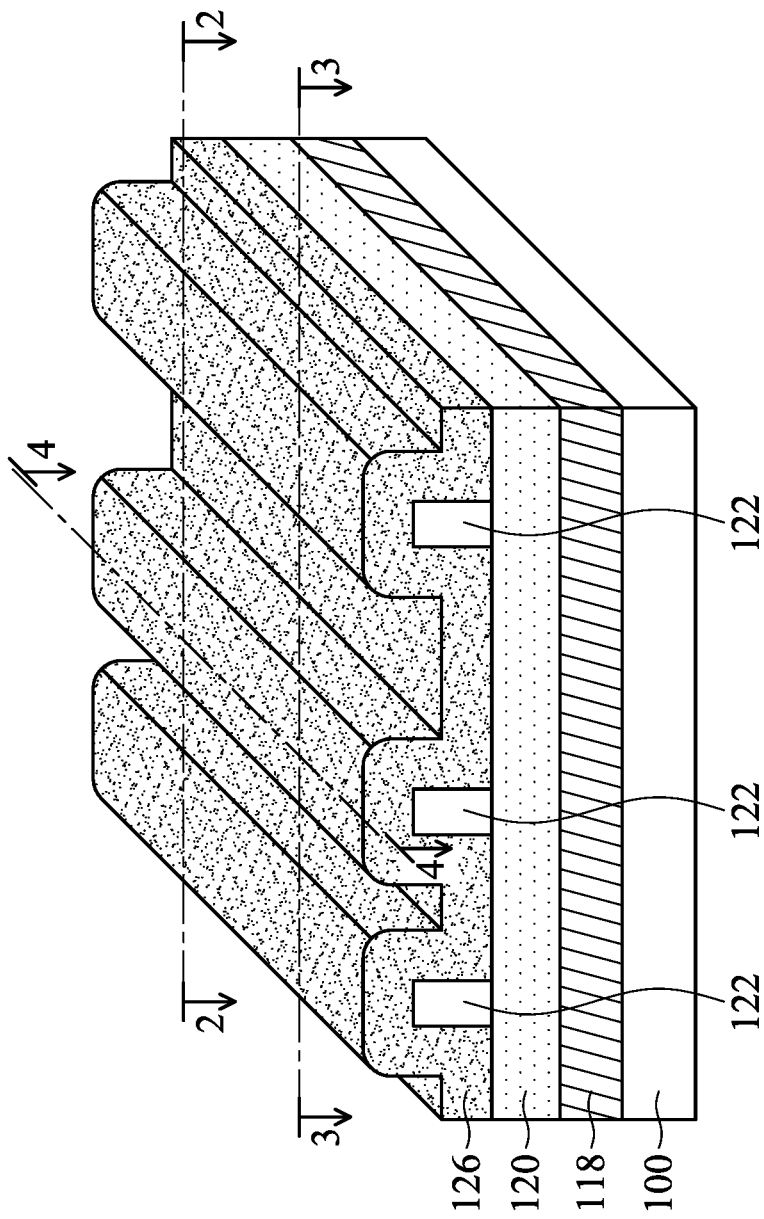
Figures 2, 2B:
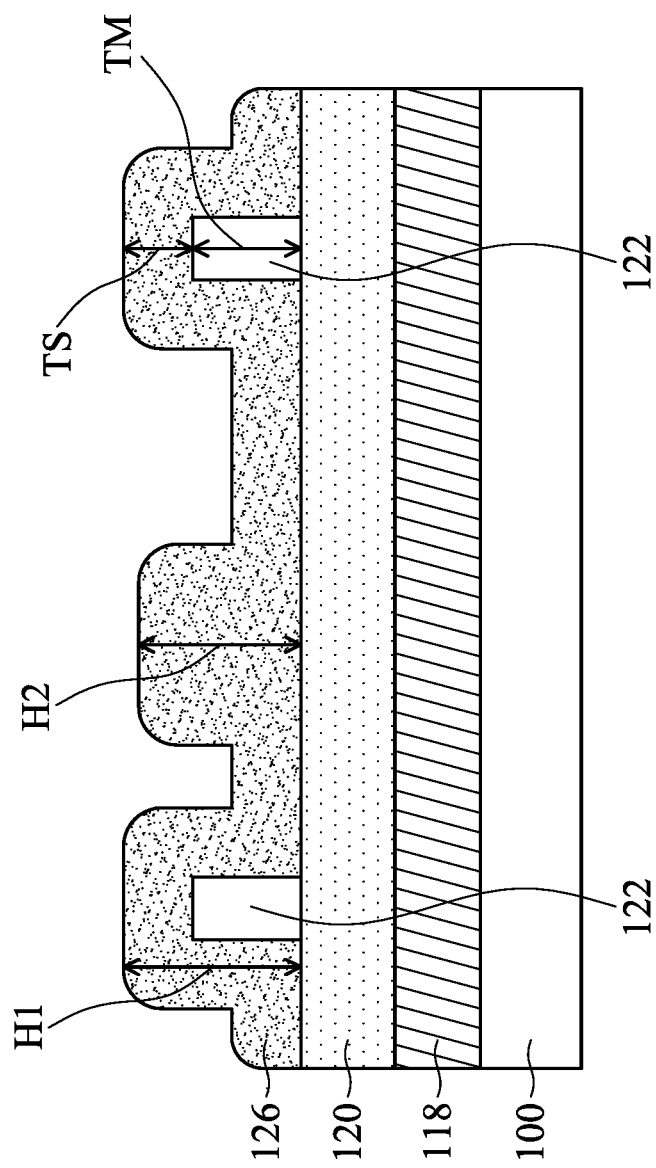
Figures 2, 2B, 3:
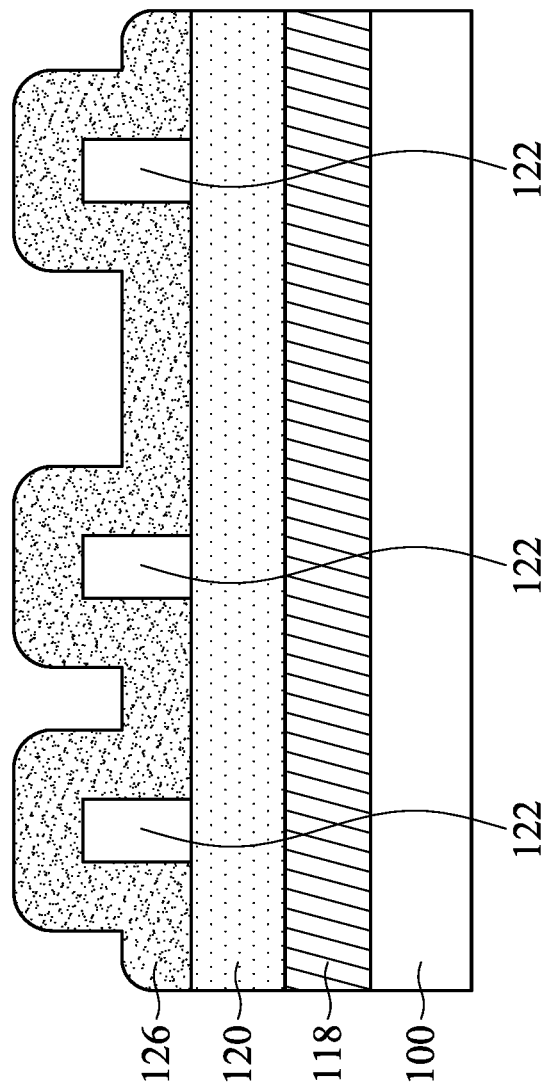
Figures 2, 2B, 3, 4:
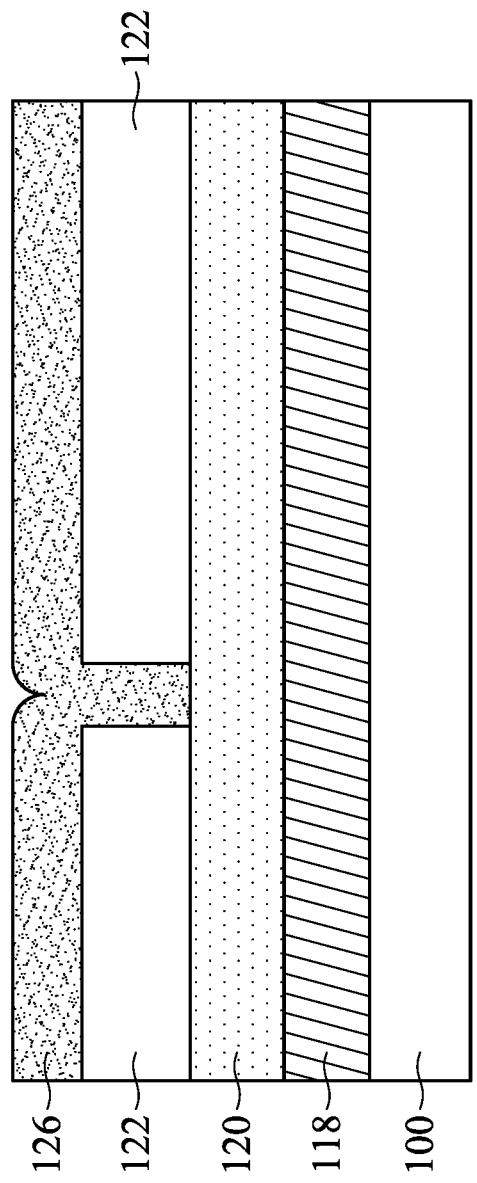
Figures 1, 2C:
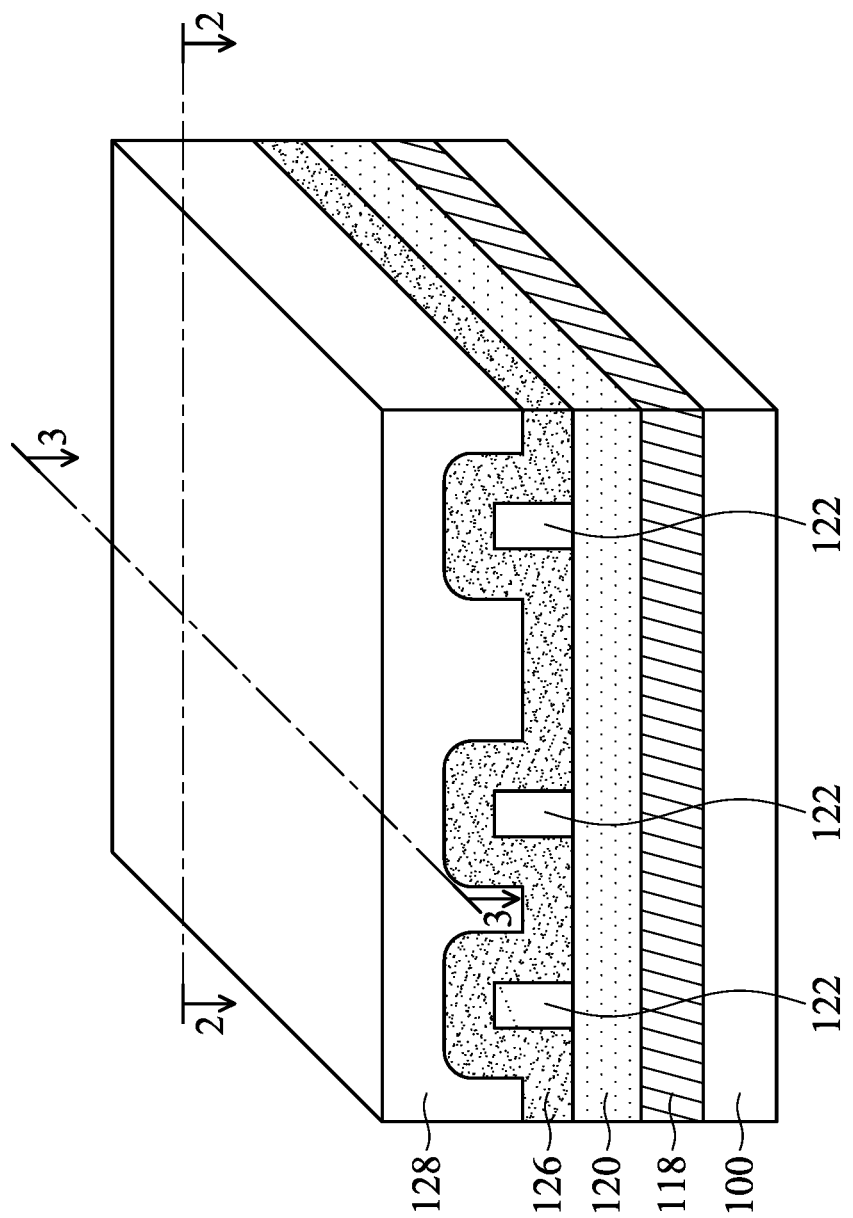
Figures 2, 2C:
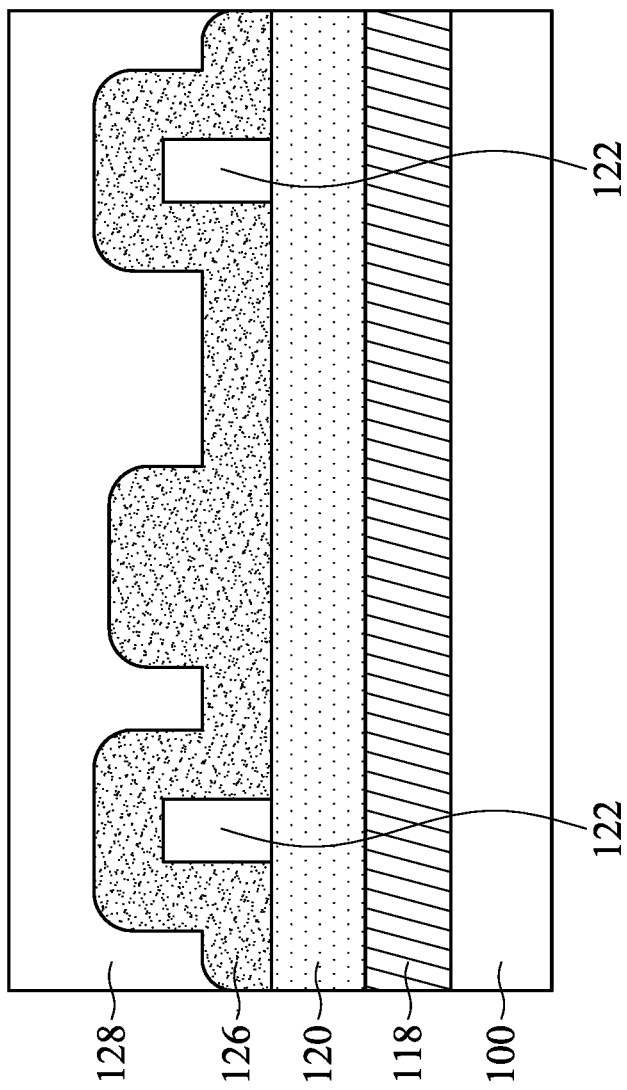
Figures 2, 2C, 3:
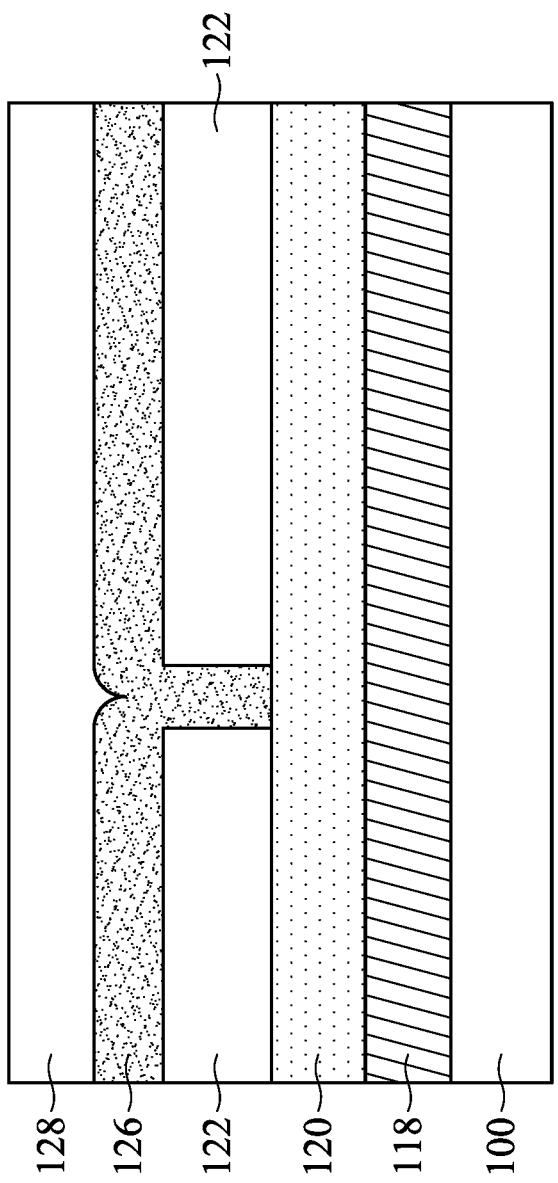
Figures 1, 2D:
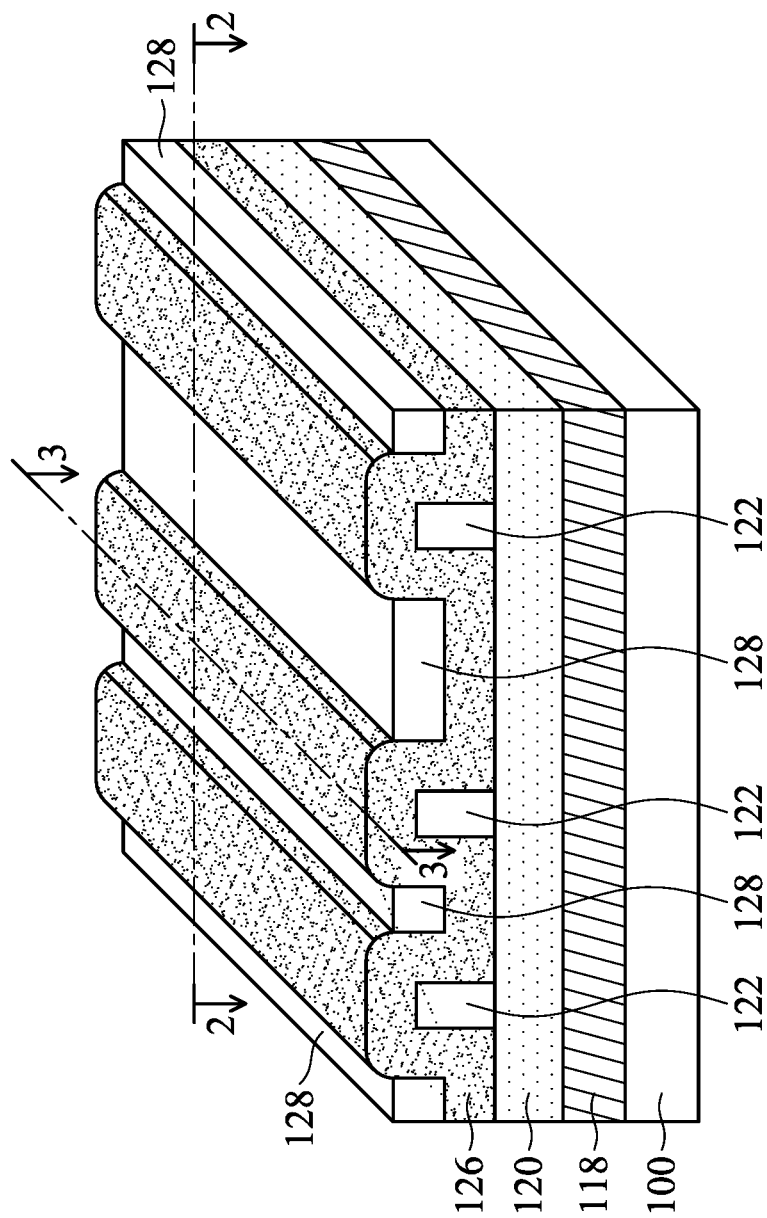
Figures 2, 2D:
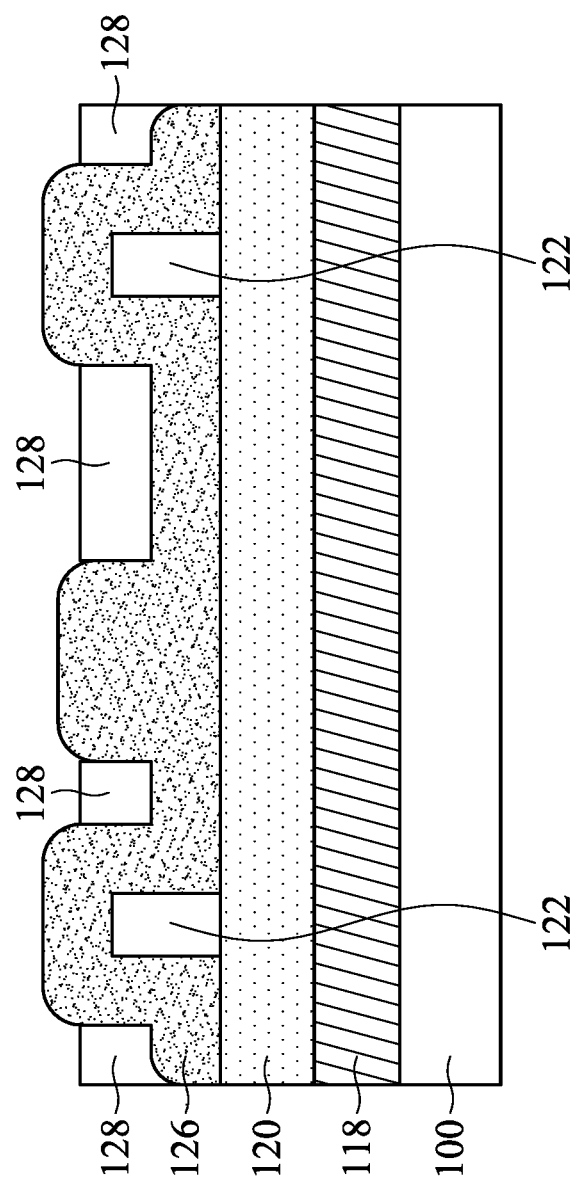
Figures 2, 2D, 3:
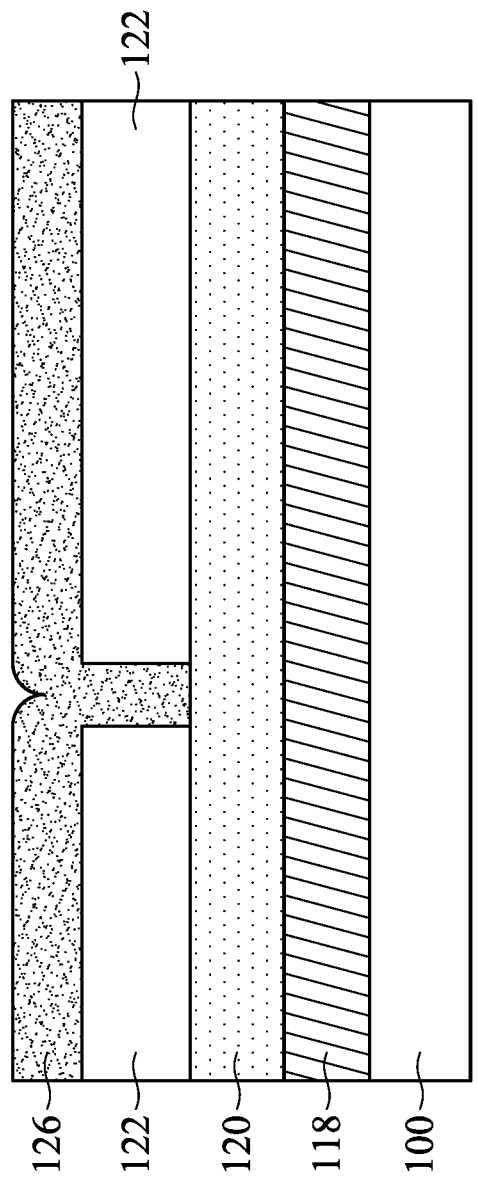
Figures 1, 2E:
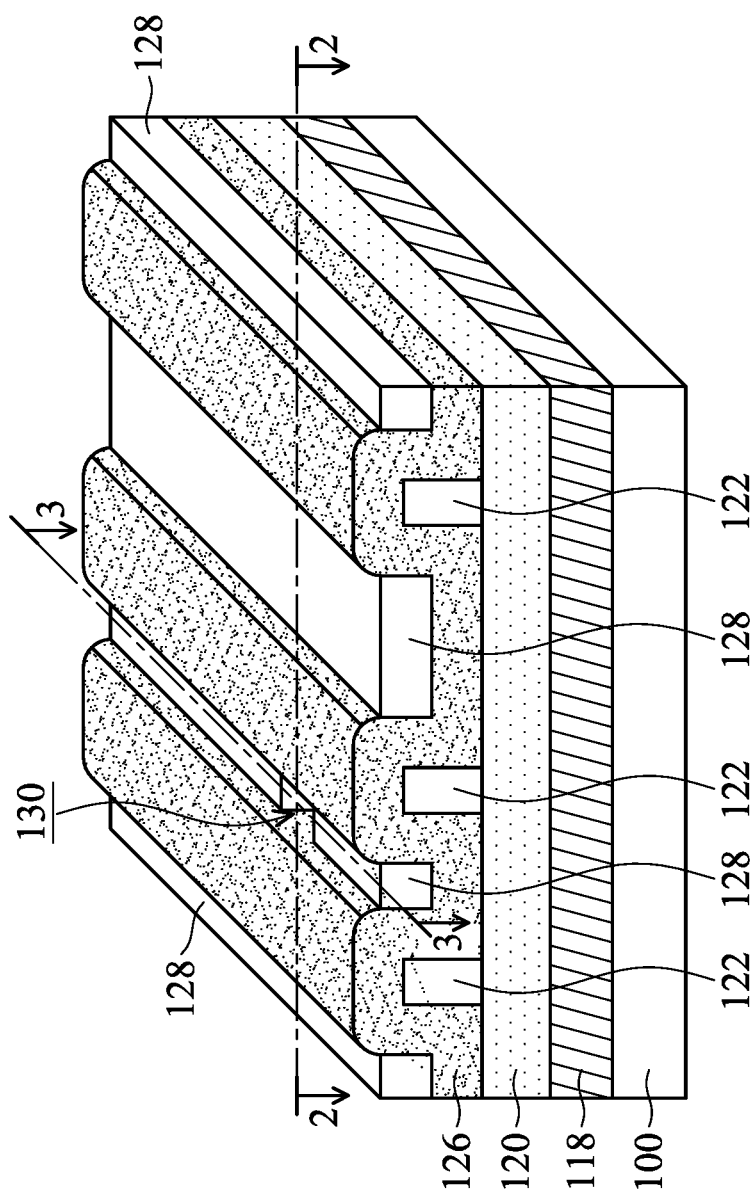
Figures 2, 2E:
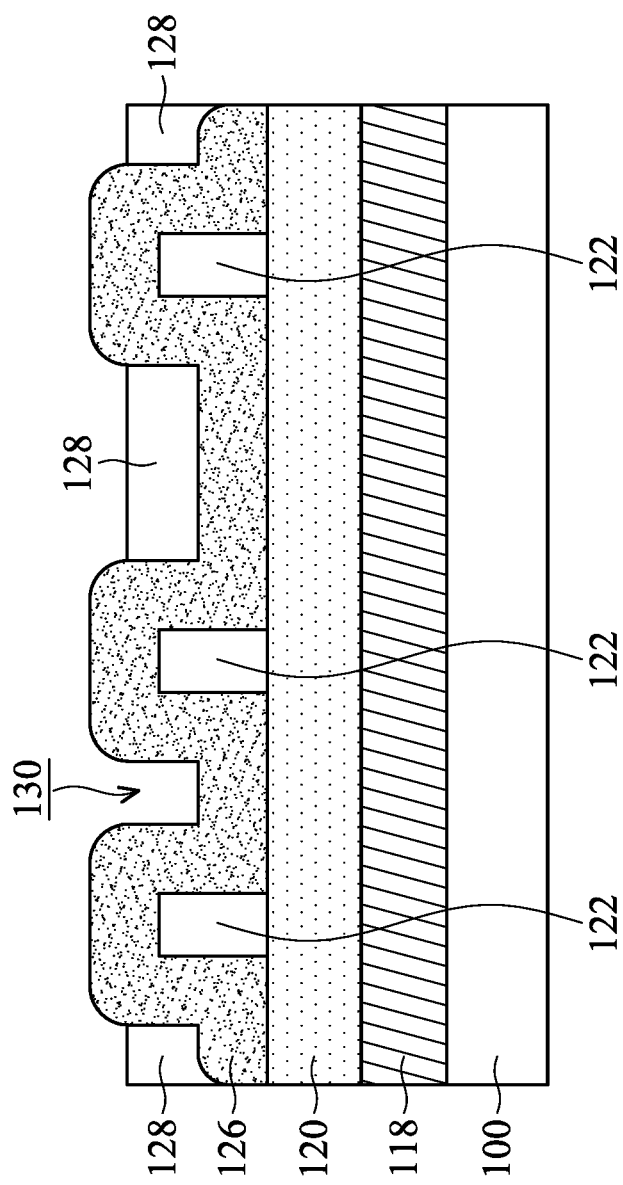
Figures 2, 2E, 3:
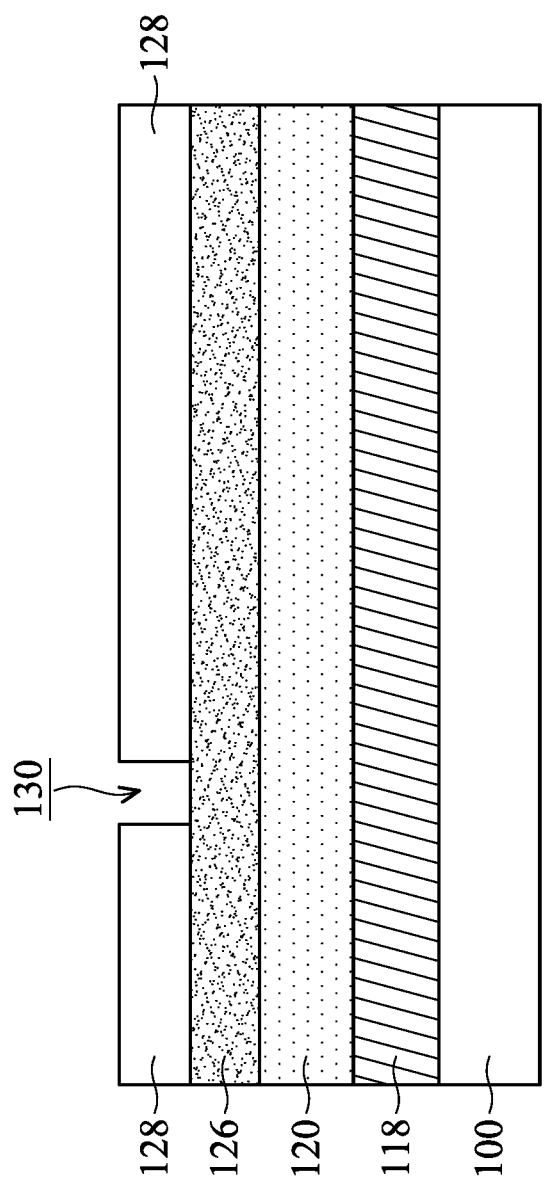
Figures 1, 2F:
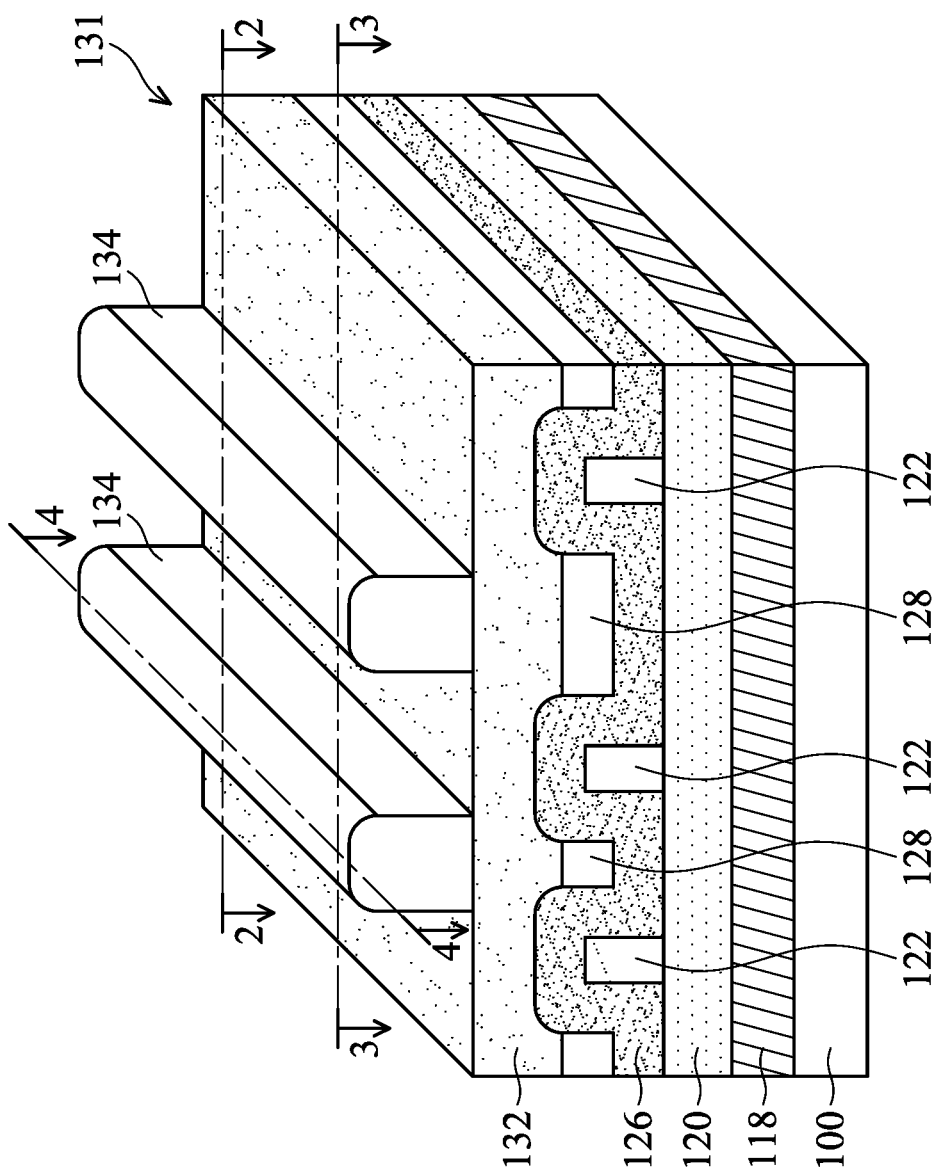
Figures 2, 2F:
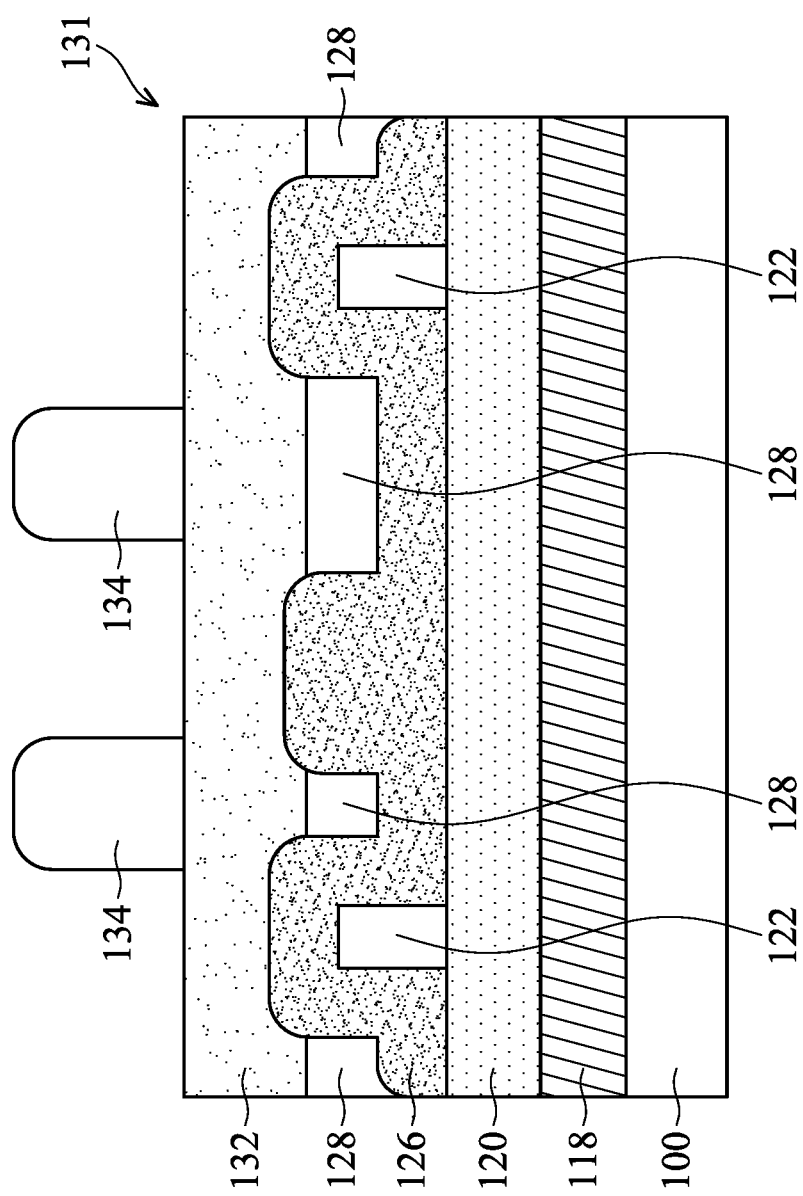
Figures 2, 2F, 3:
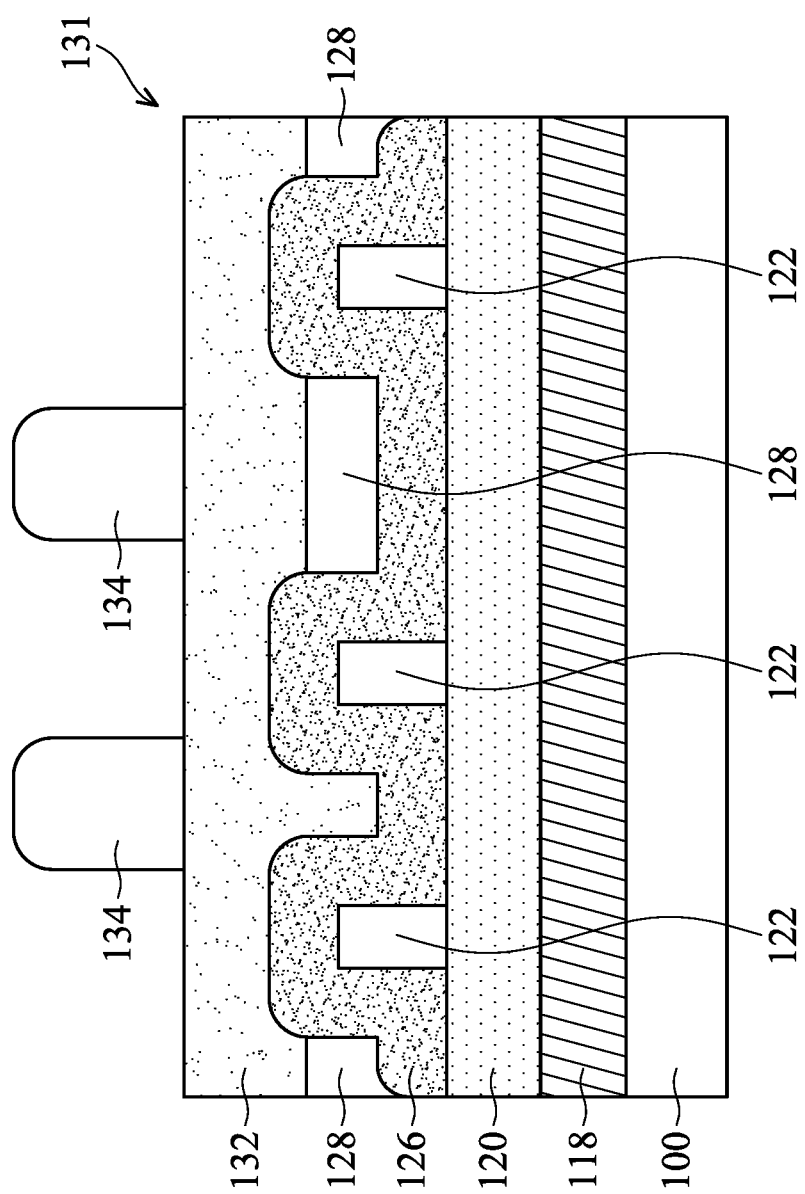
Figures 2, 2F, 3, 4:
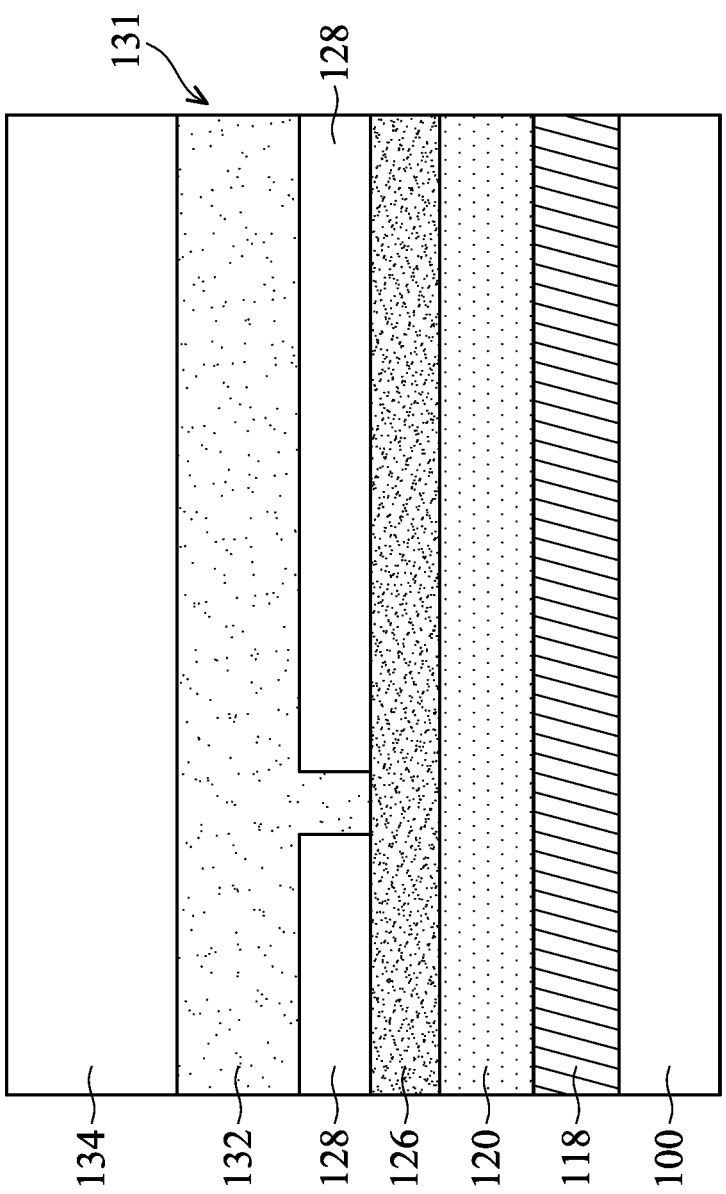

In some embodiments as shown in FIG. 2B-2, the first mandrels 122 have a thickness TM, and the spacer layer 126 has a thickness TS. In some embodiments, the spacer layer 126 is thinner than the first mandrels 122, and the thickness TS of the spacer layer 126 is less than the thickness TM of the first mandrels 122. In some embodiments, the ratio of the thickness TS of the spacer layer 126 to the thickness TM of the first mandrels 122 is in a range of about ½ to about 1/10.

In some embodiments, the spacer layer 126 is deposited in the first opening 124. In some embodiments, the spacer layer 126 completely fills up the first opening 124, and the top surface of the spacer layer 126 in the first opening 124 is higher than the top surface of the first mandrels 122. In some embodiments as shown in FIG. 2B-4, the top surface of the spacer layer 126 in the first opening 124 is lower than the top surface of the spacer layer 126 over the first mandrels 122.

Next, the second mandrel material 128 is formed over the spacer layer 126, as shown in FIGS. 2C-1, 2C-2, 2C-3 in accordance with some embodiments. In some embodiments, the second mandrel material 128 covers the top surface of the spacer layer 126. In some embodiments, the top surface of the second mandrel material 128 is higher than the top surface of the spacer layer 126. In some embodiments, the hard mask layer 120 and the second mandrel material 128 are separated by the spacer layer 126.

The second mandrel material 128 may include SiO, Si, SiN, SiCN, SiON, SiOC, metal nitrides such as TaN, metal carbide, metal oxide, metals, other applicable materials, or a combination thereof. In some embodiments, the second mandrel material 128 and the first mandrels 122 are made of the same material, since the first mandrels 122 and the second mandrel material 128 may be etched at the same time in subsequent etching process. In some embodiments, the second mandrel material 128 and the first mandrels 122 are made of different materials, as long as the first mandrels 122 and the second mandrel material 128 may be etched at the same time in subsequent etching process.

The second mandrel material 128 may be formed by chemical vapor deposition process (CVD) such as a flowable CVD (FCVD) process, a physical vapor deposition process (PVD), (e.g., evaporation or sputter), an atomic layer deposition process (ALD), other suitable processes, or a combination thereof to blanketly deposit a second mandrel material 128 over the spacer layer 126.

Next, a planarization process such as a chemical mechanical polishing (CMP) process and an etch back process is performed to remove a portion of the second mandrel material 128 and to expose the top surface of the spacer layer 126, as shown in FIGS. 2D-1, 2D-2, 2D-3 in accordance with some embodiments. In some embodiments, a planarization process such as a chemical mechanical polishing (CMP) process is performed first to thin the second mandrel material 128. Later, an etching process is performed to further recess the second mandrel material 128, and the top surface of the spacer layer 126 is exposed. If the spacer layer 126 is not exposed, the spacer layer 126 may not be etched in subsequent etching process. The etching process may be a dry etching process or a wet etching process.

Afterwards, a portion of the second mandrel material 128 is removed, and a second opening 130 is formed in the second mandrel material 128 by a patterning process, as shown in FIGS. 2E-1, 2E-2, 2E-3 in accordance with some embodiments. The second opening 130 may define the position of openings formed in subsequently formed second mandrels. In some embodiments, the top surface of the spacer layer 126 is exposed in the second opening 130. The patterning process may include a lithography process (e.g., coating the resist, soft baking, exposure, post-exposure baking, developing, other applicable processes, or a combination thereof), an etching process (e.g., wet etching process, dry etching process, other applicable processes, or a combination thereof), other applicable processes, or a combination thereof.

Next, a lithography process is performed to define the position of the second mandrels, and a patterned mask structure 131 is formed over the spacer layer 126 and the second mandrel material 128, as shown in FIGS. 2F-1, 2F-2, 2F-3, 2F-4 in accordance with some embodiments. A multi-layer mask structure 131 may include a bottom layer and/or a middle layer 132 and a top layer 134.

The bottom layer and/or the middle layer 132 and the top layer 134 may be sequentially deposited over the spacer layer 126 and the second mandrel material 128. The bottom layer and/or the middle layer 132 and the top layer 134 may be made of or include a photoresist or photo-sensitive material, one or more other suitable materials, or a combination thereof. The bottom layer may be made of or includes $C_xH_yO_z$, where x, y, and z may be a positive integer. The middle layer may be made of or includes $SiC_xH_yO_z$, where x, y, and z may be a positive integer. The top layer 134 may be made of or includes $C_xH_yO_z$, where x, y, and z may be a positive integer. However, embodiments of the disclosure are not limited thereto. The bottom layer and/or the middle layer 132 and the top layer 134 may be deposited using a PVD process, a CVD process, a spin-on process, another applicable process, or a combination thereof.

In some embodiments as shown in FIGS. 2F-3 and 2F-4, the multi-layer mask structure 131 is filled in the second opening 130. For example, as shown in FIGS. 2F-3 and 2F-4, the bottom layer and/or the middle layer 132 is filled in the second opening 130. In some embodiments, the multi-layer mask structure 131 is in contact with the spacer layer 126 in the second opening 130.

The top layer 134 is patterned, and multiple lines are formed in the top layer 134, as shown in FIGS. 2F-1, 2F-2, 2F-3, 2F-4 in accordance with some embodiments. The top layer 134 may be patterned by a photolithography process, which may include one or more exposure, developing, rinsing, and baking processes.

Afterwards, the bottom layer and/or the middle layer 132 may be patterned or etched using the patterned top layer 134 as an etch mask. As a result, the multiple lines may be transferred into the bottom layer and/or the middle layer 132 (not shown). The patterned top layer 134 may be removed during the patterning of the bottom layer and/or the middle layer 132.

In some embodiments, the bottom layer and/or the middle layer 132 are sequentially patterned using one or more etching processes, one or more other applicable processes, or a combination thereof. The etching process may be a dry etching process, one or more other applicable processes, or a combination thereof. The bottom layer and/or the middle layer 132 may remain over the second mandrel material 128. The remaining bottom layer and/or the middle layer 132 may be removed using an ashing process, one or more other applicable processes, or a combination thereof.

Later, the patterned bottom layer and/or the middle layer 132 is subsequently used as an etch mask to pattern the second mandrel material 128, and the second mandrels 128 are formed, as shown in FIGS. 2G-1, 2G-2, 2G-3 in accordance with some embodiments. In some embodiments, the second mandrels 128 with second opening 130 is formed over the spacer layer 126 between the first mandrels 122.

Figures 1, 2G:
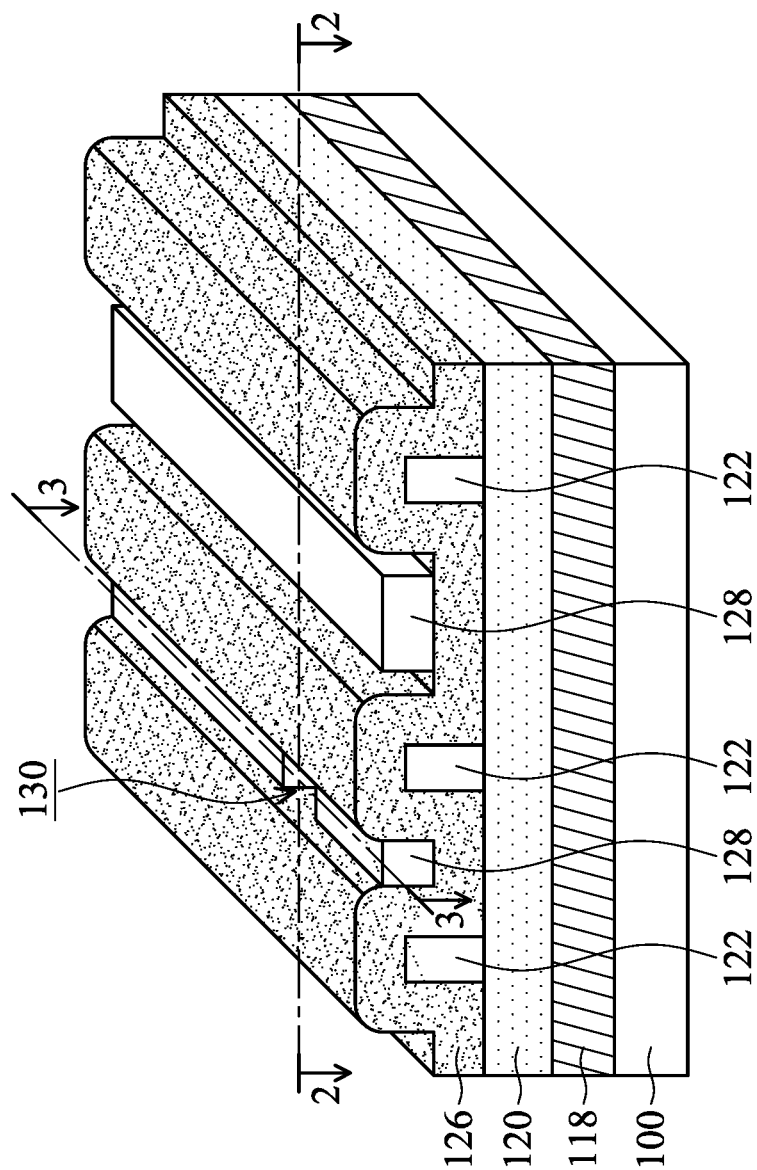
Figures 2, 2G:
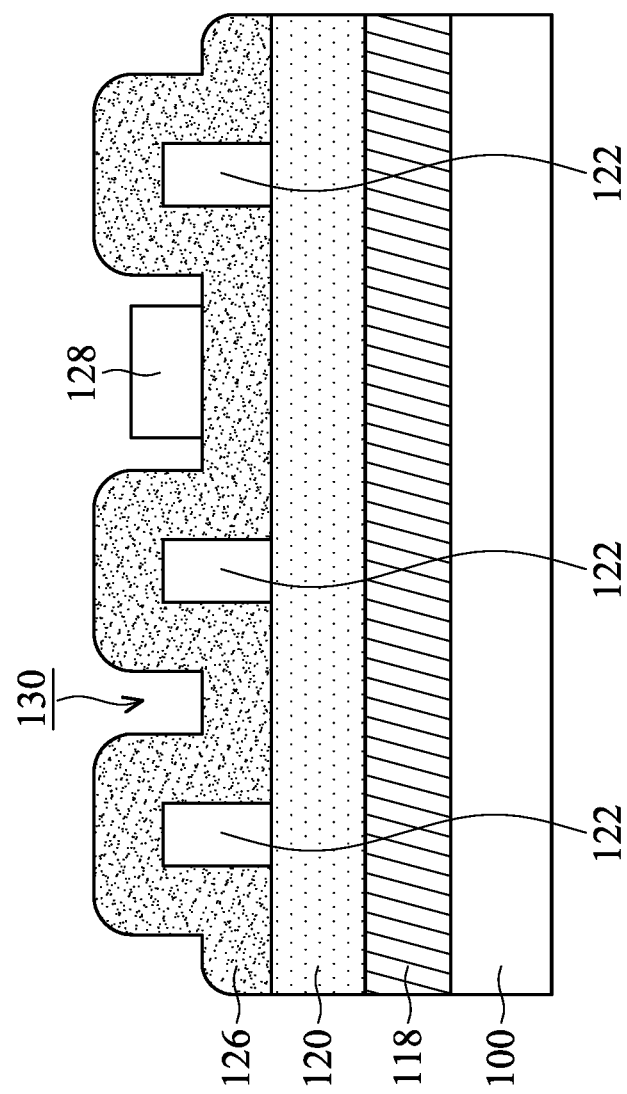
Figures 2, 2G, 3:
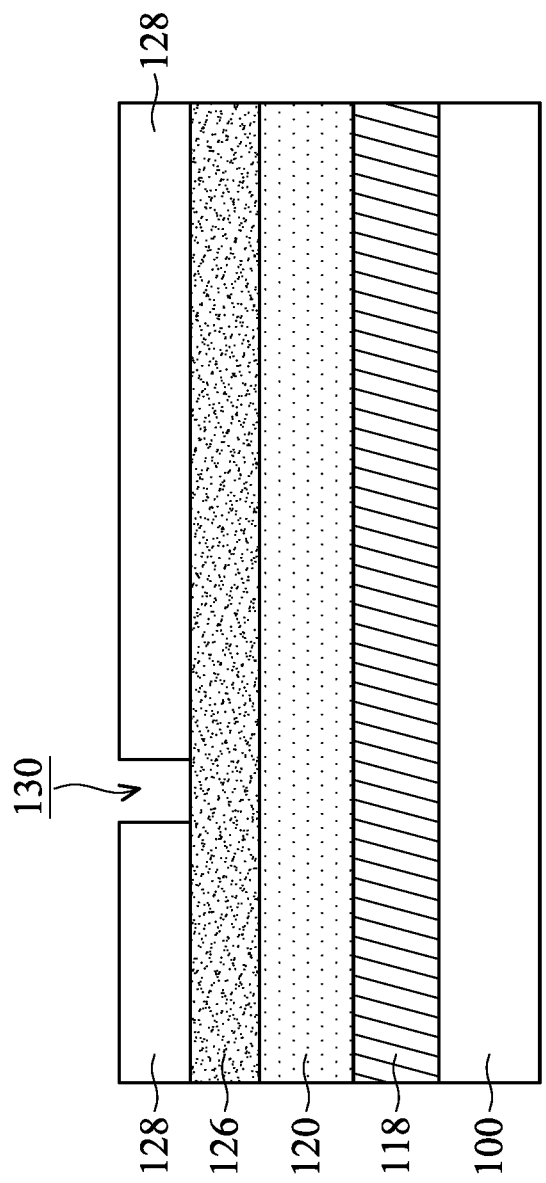
Figures 1, 2H:
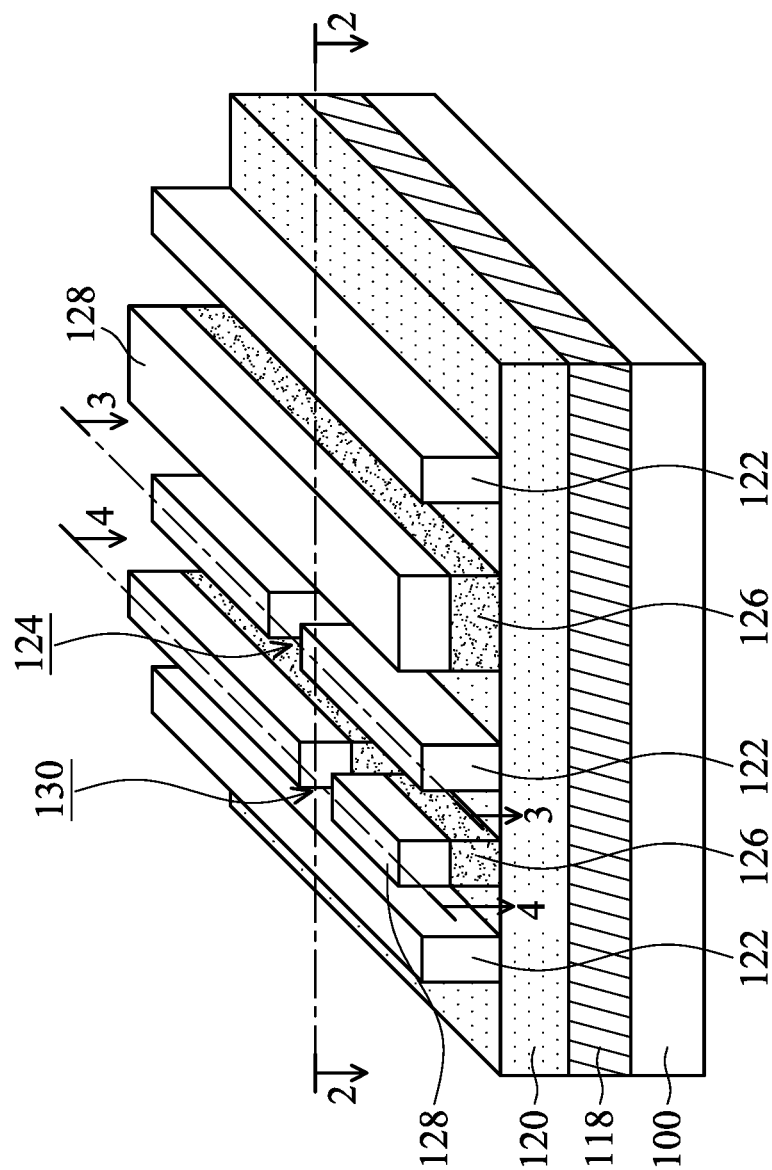
Figures 2, 2H:
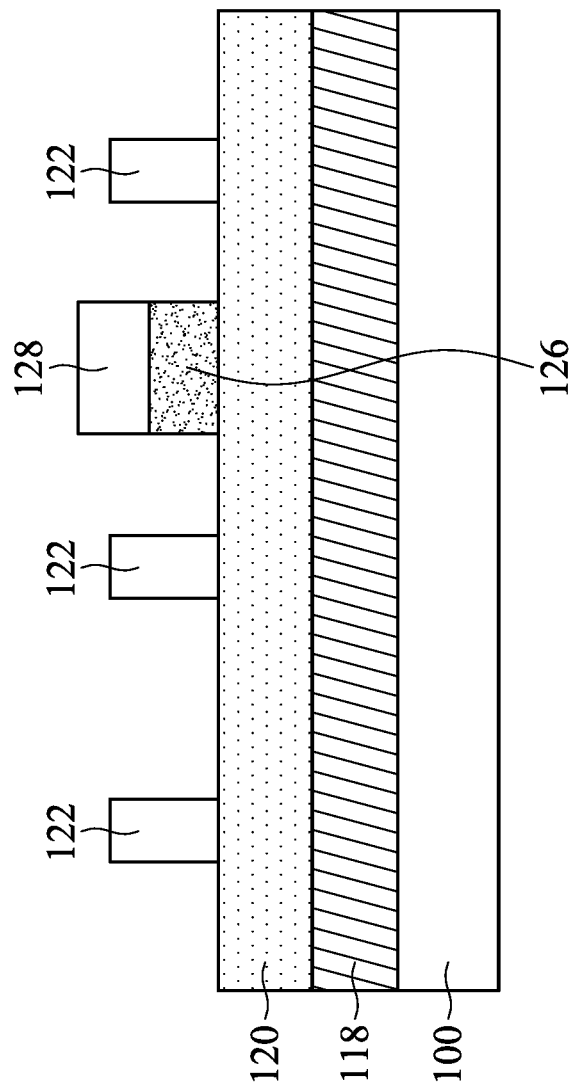
Figures 2, 2H, 3:
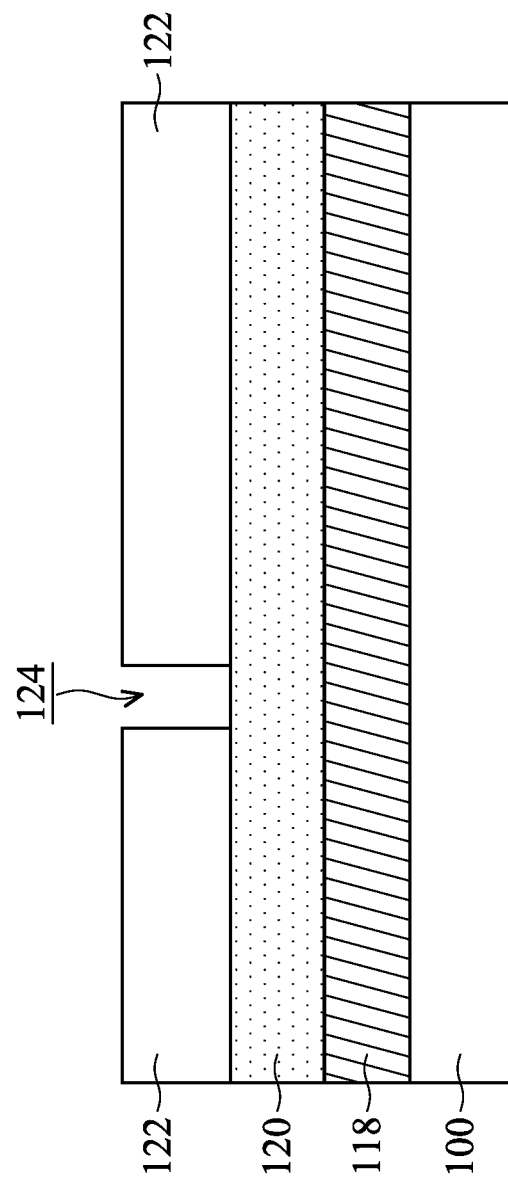
Figures 2, 2H, 3, 4:
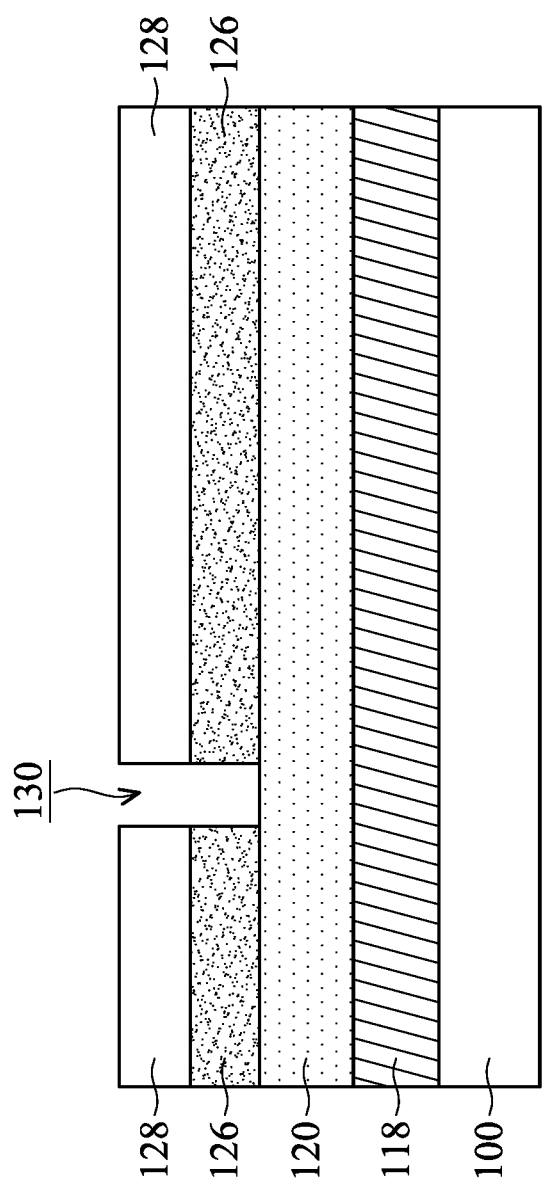
Figures 1, 2I:
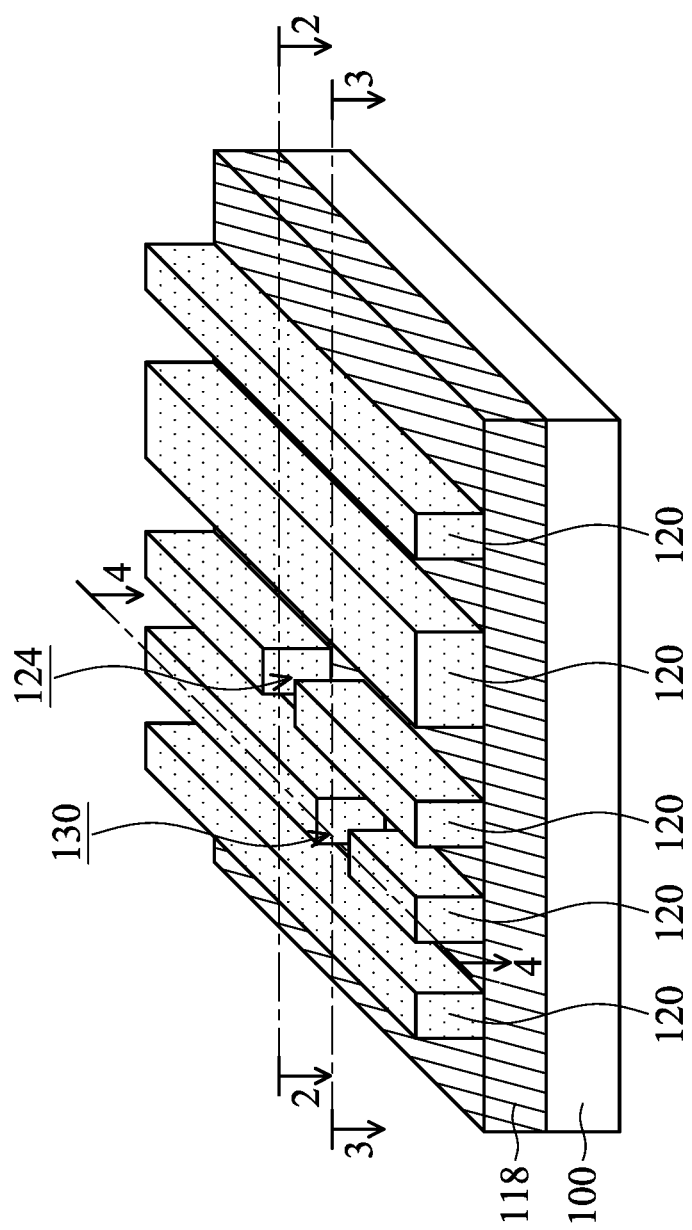
Figures 2, 2I:
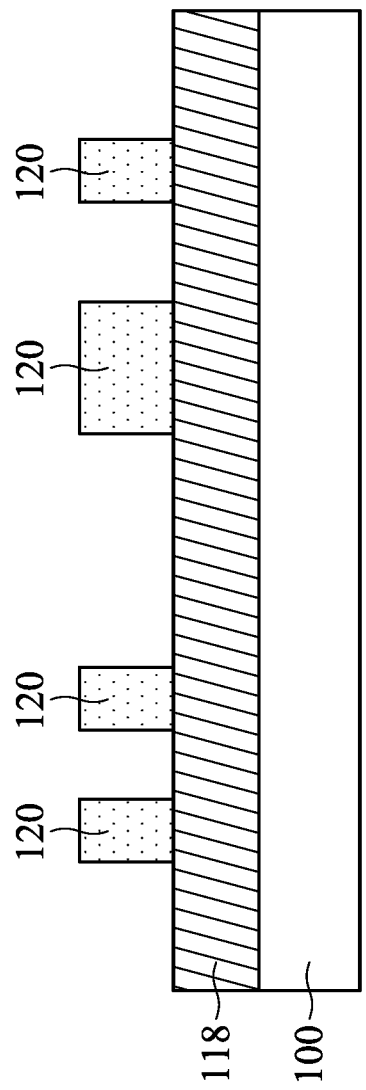
Figures 2, 2I, 3:
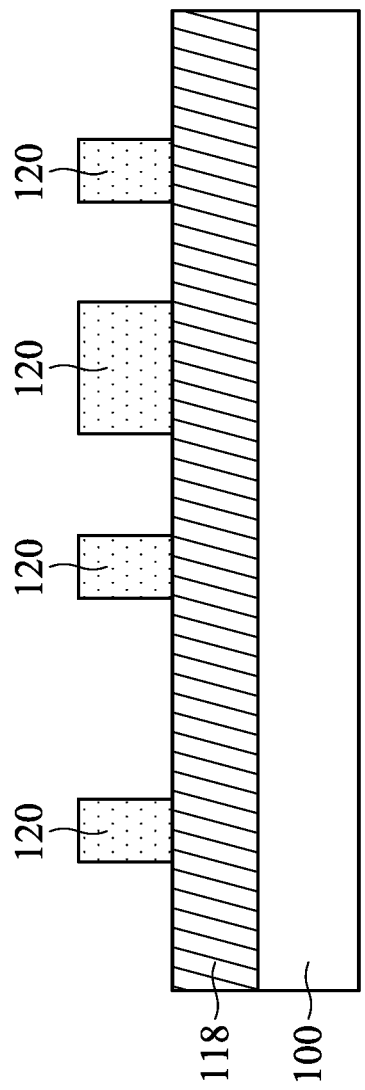
Figures 2, 2I, 3, 4:
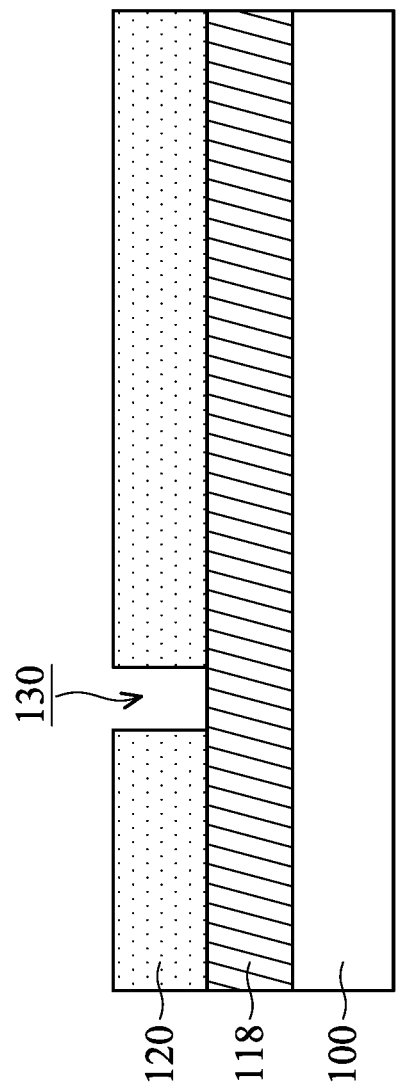
Figures 1, 2J:
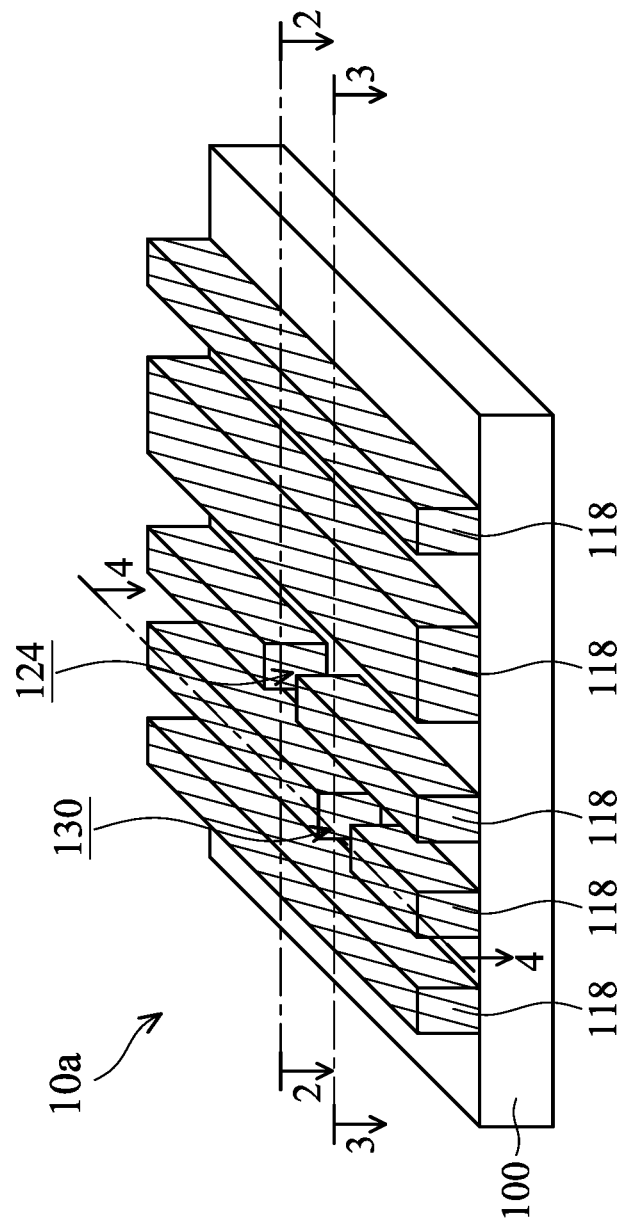
Figures 2, 2J:
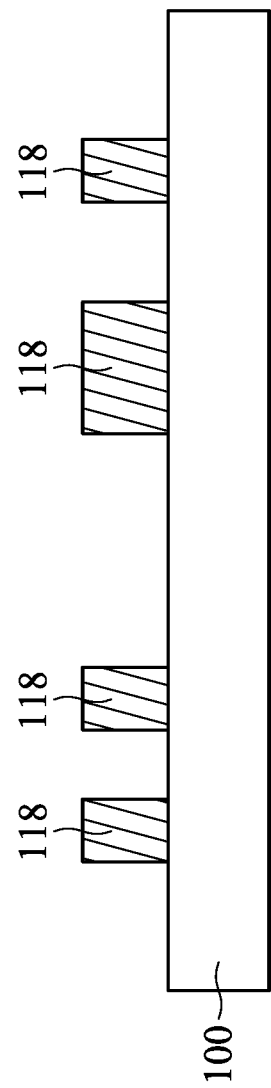
Figures 2, 2J, 3:
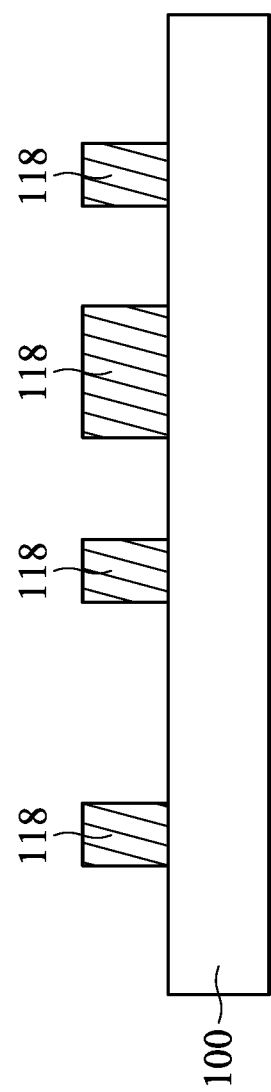
Figures 2, 2J, 3, 4:
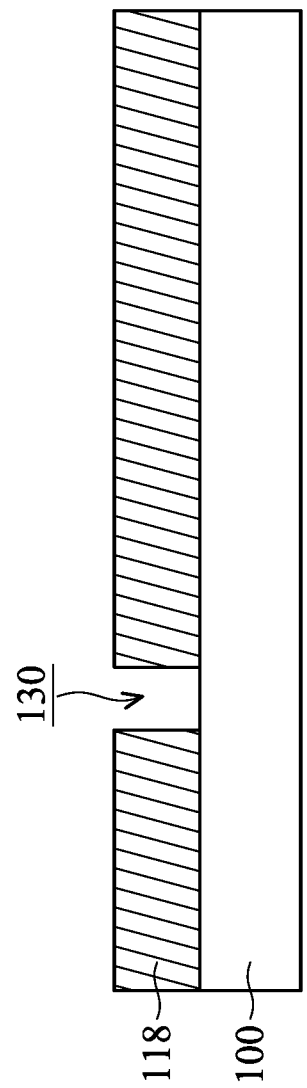

In some embodiments, the sidewalls of some of the second mandrels 128 are separated from the spacer layer 126. For example, the sidewalls of the second mandrels 128 on the right side in FIG. 2G-1 is separated from the spacer layer 126. In some embodiments, the sidewalls of some of the second mandrels 128 are in contact with the spacer layer 126. For example, the sidewalls of the second mandrels 128 on the left side in FIG. 2G-1 is in contact with the spacer layer 126. In some embodiments, the critical dimension of the second mandrels 128 is in a range of about 10 nm to about 150 nm.

Next, the spacer layer 126 is etched and the hard mask layer 120 between the first mandrels 122 and the second mandrels 128 is exposed, as shown in FIGS. 2H-1, 2H-2, 2H-3, 2H-4 in accordance with some embodiments. In some embodiments, the spacer layer 126 is dry etched. The dry etching process may include using a fluorine-based etchant gas, such as $SF_6$, $C_xF_y$ (where x and y may be positive integers), $NF_3$, or a combination thereof.

In some embodiments, the spacer layer 126 over the first mandrels 122 and the hard mask layer 120 is removed, and the top surface of the hard mask layer 120 between the first mandrels 122 and the second mandrels 128 is exposed. In some embodiments, after the spacer layer 126 is etched, the spacer layer 126 under the second mandrels 126 remains. Therefore, in some embodiments, the top surface of the second mandrels 128 is higher than the top surface of the first mandrels 122. In some embodiments, the second mandrels 122 and the hard mask layer 120 are separated by the spacer layer 126 after the spacer layer 126 is etched.

Afterwards, the hard mask layer 120 is etched using the first mandrels 122 and the second mandrels 128 as an etch mask, as shown in FIGS. 2I-1, 2I-2, 2I-3, 2I-4 in accordance with some embodiments. The first mandrels 122 and the second mandrels 128 may be removed after the etching process. The etching process may be a dry etching process or a wet etching process. As a result, a patterned hard mask layer 120 has multiple lines with openings 124 and 130 may be obtained.

Next, the target layer 118 is etched using the hard mask layer 120 as an etch mask, as shown in FIGS. 2J-1, 2J-2, 2J-3, 2J-4 in accordance with some embodiments. The hard mask layer 120 may be removed after the etching process. The etching process may be a dry etching process or a wet etching process. As a result, a patterned target layer 118 has multiple lines with openings 124 and 130 may be obtained. In some embodiments, the patterned target layer 118 and the patterned hard mask layer 120 have the same pattern. In some embodiments, the target layer 118 is patterned by the hard mask layer 120 directly without an extra reverse tone process.

It should be noted that, although in previous embodiments, a finFET structure 100 is showed as the semiconductor device 100, the present disclosure is not limited thereto. In some embodiments, the semiconductor device 100 includes logic devices, memory devices (e.g., static random access memories, SRAMs), radio frequency (RF) devices, input/output (I/O) devices, system-on-chip (SoC) devices, image sensor devices, other applicable types of devices, or a combination thereof. In addition, the target layer line 118 may also be a line 118 in the front-end-of-line (FEOL) process.

By depositing a second mandrel material 128 over the spacer layer 126 before forming a second opening 130 in the second mandrel 128, the first mandrels 122 and the second mandrels 128 with small pitch may be formed over the hard mask layer 120. The first mandrels 122 and the second mandrels 128 may form an etch mask for underlying hard mask layer 120 and target layer 118, and the pattern of the etch mask and the target layer 118 are the same. Therefore, the target layer lines 118 are formed by a line-based self-aligned litho-etch-litho-etch (LELE) process. Without the reverse tone process, the production time and cost may be reduced.

As described previously, the target layer lines 118 are formed by a line-based self-aligned LELE process. The mask structure for patterning the target layer lines 118 may be formed by depositing the second mandrel material 128 before forming the second opening 130 in the second mandrel 128, and the mask structure with the first mandrels 122 and the second mandrels 128 may be formed over the hard mask layer 120. Since the patterns of the mask structure and the target layer lines 118 are the same, the hard mask layer 120 may be etched using the first mandrels 122 and the second mandrels 128 directly without an extra reverse tone process. Therefore, production time and cost may be reduced.

Embodiments of method of forming a semiconductor device structure is provided. The method for forming the semiconductor structure may include a line-based self-aligned LELE process to form metal lines with small pitch. By forming a second mandrel material before defining an opening in the second mandrel material, the first mandrels and the second mandrels of the mask structure with small pitches may be formed. Since the mask structure and the target metal lines has the same pattern, the metal lines are formed without an extra reverse tone process. The production time and cost may be reduced.

In some embodiments, a method for forming a semiconductor structure is provided. A method for forming a semiconductor structure includes forming a hard mask layer over a target layer. The method for forming a semiconductor structure also includes forming first mandrels over the hard mask layer. The method for forming a semiconductor structure also includes forming a first opening in the first mandrels. The method for forming a semiconductor structure also includes depositing a spacer layer over the hard mask layer and the first mandrels. The method for forming a semiconductor structure also includes depositing a second mandrel material over the spacer layer. The method for forming a semiconductor structure also includes planarizing the second mandrel material. The method for forming a semiconductor structure also includes forming a second opening in the second mandrel material. The method for forming a semiconductor structure also includes patterning and etching the second mandrel material to form second mandrels. The method for forming a semiconductor structure also includes etching the spacer layer. The method for forming a semiconductor structure also includes etching the hard mask layer and the target layer.

In some embodiments, a method for forming a semiconductor structure is provided. The method for forming a semiconductor structure also includes depositing a target layer over a semiconductor device. The method for forming a semiconductor structure also includes depositing a hard mask layer over the target layer. The method for forming a semiconductor structure also includes forming first mandrels over the hard mask layer. The method for forming a semiconductor structure also includes forming a spacer layer over the first mandrels. The method for forming a semiconductor structure also includes depositing a second mandrel material over the spacer layer. The method for forming a semiconductor structure also includes planarizing the second mandrel material. The method for forming a semiconductor structure also includes removing a portion of the second mandrel material to form a second opening. The method for forming a semiconductor structure also includes patterning the second mandrel material to form second mandrels over the spacer layer between the first mandrels. The method for forming a semiconductor structure also includes etching the spacer layer to expose the hard mask layer. The method for forming a semiconductor structure also includes etching the hard mask layer. The method for forming a semiconductor structure also includes patterning the target layer using the hard mask layer.

In some embodiments, a method for forming a semiconductor structure is provided. The method for forming a semiconductor structure includes forming a hard mask layer over a target layer. The method for forming a semiconductor structure also includes forming first mandrels over the hard mask layer. The method for forming a semiconductor structure also includes conformally depositing a spacer layer over the first mandrels. The method for forming a semiconductor structure also includes forming second mandrels with a second opening over the spacer layer between the first mandrels. The method for forming a semiconductor structure also includes dry etching the spacer layer to expose the top surface of the hard mask layer. The method for forming a semiconductor structure also includes etching the hard mask layer using the first mandrels and the second mandrels as mask layers. The method for forming a semiconductor structure also includes etching the target layer using the hard mask layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    forming a hard mask layer over a target layer;
    forming first mandrels over the hard mask layer;
    forming a first opening in the first mandrels;
    depositing a spacer layer over the hard mask layer and the first mandrels;
    depositing a second mandrel material over the spacer layer;
    planarizing the second mandrel material;
    forming a second opening in the second mandrel material;
    patterning and etching the second mandrel material to form second mandrels;
    etching the spacer layer; and
    etching the hard mask layer and the target layer.

2. The method for forming the semiconductor structure as claimed in claim 1, wherein the spacer layer is conformally deposited over the hard mask layer and the first mandrels.

3. The method for forming the semiconductor structure as claimed in claim 1, wherein the spacer layer is deposited in the first opening.

4. The method for forming the semiconductor structure as claimed in claim 3, wherein a top surface of the spacer layer in the first opening is lower than a top surface of the spacer layer over the first mandrels.

5. The method for forming the semiconductor structure as claimed in claim 1, further comprising:
    recessing the second mandrel material to expose a top surface of the spacer layer after planarizing the second mandrel material.

6. The method for forming the semiconductor structure as claimed in claim 1, wherein sidewalls of some of the second mandrels are in contact with the spacer layer before the spacer layer is etched.

7. The method for forming the semiconductor structure as claimed in claim 1, wherein the spacer layer under the second mandrels remains after the spacer layer is etched.

8. A method for forming a semiconductor structure, comprising:
    depositing a target layer over a semiconductor device;
    depositing a hard mask layer over the target layer;
    forming first mandrels over the hard mask layer;
    forming a spacer layer over the first mandrels;
    depositing a second mandrel material over the spacer layer;
    planarizing the second mandrel material;
    removing a portion of the second mandrel material to form a second opening;
    patterning the second mandrel material to form second mandrels over the spacer layer between the first mandrels;
    etching the spacer layer to expose the hard mask layer;
    etching the hard mask layer; and
    patterning the target layer using the hard mask layer.

9. The method for forming the semiconductor structure as claimed in claim 8, further comprising:
    forming a first opening in the first mandrels before depositing the spacer layer.

10. The method for forming the semiconductor structure as claimed in claim 8, wherein the first mandrels and the second mandrels are made of the same material.

11. The method for forming the semiconductor structure as claimed in claim 8, wherein the first mandrels and the hard mask layer are made of different materials.

12. The method for forming the semiconductor structure as claimed in claim 8, wherein sidewalls of some of the second mandrels are separated from the spacer layer before the spacer layer is etched.

13. The method for forming the semiconductor structure as claimed in claim 8, wherein a top surface of the second mandrels is higher than a top surface of the first mandrels after the spacer layer is etched.

14. The method for forming the semiconductor structure as claimed in claim 8, wherein the hard mask layer and the second mandrel material are separated by the spacer layer.

15. A method for forming a semiconductor structure, comprising:
    forming a hard mask layer over a target layer;
    forming first mandrels over the hard mask layer;
    conformally depositing a spacer layer over the first mandrels;
    forming second mandrels with a second opening over the spacer layer between the first mandrels;
    forming a photoresist layer in the second opening, wherein the photoresist layer is in contact with the spacer layer in the second opening;
    dry etching the spacer layer to expose the expose a top surface of the hard mask layer;
    etching the hard mask layer using the first mandrels and the second mandrels as mask layers; and
    etching the target layer using the hard mask layer.

16. The method for forming the semiconductor structure as claimed in claim 15, further comprising:
    forming a first opening in the first mandrels.

17. The method for forming the semiconductor structure as claimed in claim 15, wherein the second opening exposes a top surface of the spacer layer.

18. The method for forming the semiconductor structure as claimed in claim 15, wherein the second mandrels and the hard mask layer are separated by the spacer layer after the spacer layer is etched.

19. The method for forming the semiconductor structure as claimed in claim 15, wherein the spacer layer is thinner than the first mandrels.

20. The method for forming the semiconductor structure as claimed in claim 15, wherein a sidewall of the second mandrels is separated from a sidewall of the spacer layer.

* * * * *